United States Patent
Kim et al.

(10) Patent No.: US 10,502,999 B2
(45) Date of Patent: Dec. 10, 2019

(54) LIGHT CONTROLLING APPARATUS AND METHOD OF FABRICATING THE SAME

(71) Applicant: LG Display Co., Ltd., Seoul (KR)

(72) Inventors: Kihan Kim, Gyeonggi-do (KR);
Jiyoung Ahn, Gyeonggi-do (KR);
Moonsun Lee, Chungcheongnam-do (KR); Pureum Kim, Incheon (KR);
Seokwon Ji, Incheon (KR)

(73) Assignee: LG Display Co., Ltd., Seoul (KR)

( * ) Notice: Subject to any disclaimer, the term of this patent is extended or adjusted under 35 U.S.C. 154(b) by 316 days.

(21) Appl. No.: 14/837,146

(22) Filed: Aug. 27, 2015

(65) Prior Publication Data

US 2016/0062157 A1    Mar. 3, 2016

(30) Foreign Application Priority Data

Aug. 29, 2014 (KR) .................. 10-2014-0114174
Jun. 19, 2015 (KR) .................. 10-2015-0087771

(51) Int. Cl.
| | | |
|---|---|---|
| G02F 1/1334 | (2006.01) | |
| C09K 19/54 | (2006.01) | |
| G02F 1/1337 | (2006.01) | |
| G02F 1/1339 | (2006.01) | |
| H01L 27/32 | (2006.01) | |

(Continued)

(52) U.S. Cl.
CPC .......... *G02F 1/1334* (2013.01); *C09K 19/544* (2013.01); *G02F 1/1337* (2013.01); *G02F 1/13394* (2013.01); *H01L 27/3232* (2013.01); *H01L 51/5268* (2013.01); *G02F 1/134363* (2013.01); *G02F 2001/13345* (2013.01); *G02F 2001/13347* (2013.01)

(58) Field of Classification Search
None
See application file for complete search history.

(56) References Cited

U.S. PATENT DOCUMENTS 5,570,216 A * 10/1996 Lu .................. G02F 1/1334
                                                    349/130
5,940,156 A *  8/1999 Nishiguchi ....... G02F 1/133377
                                                    349/155

(Continued)

OTHER PUBLICATIONS

Sato et al., "Flexible Grayscale Ferroelectric Liquid Crystal Device Containing Polymer Walls and Networks", Japanese Journal of Applied Physics, 41: 5302-5306 (2002).

(Continued)

*Primary Examiner* — Edward J Glick
*Assistant Examiner* — David Y Chung
(74) *Attorney, Agent, or Firm* — Morgan, Lewis & Bockius LLP

(57) ABSTRACT

Provided are a light controlling apparatus and a method of fabricating the same. The light controlling apparatus includes: a first electrode unit and a second electrode unit facing each other; a liquid crystal unit between the first electrode unit and the second electrode unit, the liquid crystal unit including a liquid crystal; a wall having a first polymer being polymerized from a first monomer the first monomer having a higher diffusion speed than a second monomer; and a network having a second polymer being polymerized from the second monomer, the second monomer having a lower diffusion speed than the first monomer.

23 Claims, 24 Drawing Sheets

(51) Int. Cl.
*H01L 51/52* (2006.01)
*G02F 1/1343* (2006.01)

(56) References Cited

U.S. PATENT DOCUMENTS

| | | | |
|---|---|---|---|
| 7,113,243 B2* | 9/2006 | Jeong | G02F 1/134363 349/141 |
| 2003/0193709 A1* | 10/2003 | Mallya | G02F 1/1334 359/245 |
| 2006/0114383 A1* | 6/2006 | Kobayashi | G02B 5/3016 349/117 |
| 2009/0079921 A1* | 3/2009 | Mori | G02F 1/133555 349/114 |
| 2010/0053527 A1* | 3/2010 | Hsieh | C09K 19/12 349/124 |
| 2010/0128200 A1* | 5/2010 | Morishita | G02F 1/1323 349/62 |
| 2010/0321626 A1* | 12/2010 | Hsieh | C09K 19/52 349/182 |
| 2011/0085126 A1* | 4/2011 | Kajiyama | G02F 1/133788 349/191 |
| 2011/0134372 A1 | 6/2011 | Lee et al. | |
| 2011/0240920 A1* | 10/2011 | Kilickiran | C09K 19/0275 252/299.63 |
| 2012/0075563 A1* | 3/2012 | Takeda | G02F 1/133377 349/139 |
| 2012/0105793 A1* | 5/2012 | Tseng | G02F 1/13718 349/185 |
| 2012/0147297 A1 | 6/2012 | Kim et al. | |
| 2012/0313039 A1* | 12/2012 | Su | C09K 19/52 252/299.01 |
| 2013/0342772 A1 | 12/2013 | Lim et al. | |
| 2015/0036088 A1* | 2/2015 | Yoon | G02F 1/133345 349/106 |

OTHER PUBLICATIONS

Extended European Search Report issued in corresponding European Patent Application No. 15182518.9 dated Dec. 18, 2015.

* cited by examiner

LIGHT CONTROLLING APPARATUS AND METHOD OF FABRICATING THE SAME

CROSS-REFERENCE TO RELATED APPLICATIONS

This application claims the priority of Korean Patent Application No. 10-2014-0114174 filed on Aug. 29, 2014 and Korean Patent Application No. 10-2015-0087771 filed on Jun. 19, 2015, in the Korean Intellectual Property Office, the disclosures of which are incorporated herein by reference in their entireties.

BACKGROUND OF THE INVENTION

1. Field of the Invention

The present invention relates to a light controlling apparatus using a liquid crystal having a polymer and a method of fabricating the same.

2. Description of the Related Art

In recent years, as the world entered the information age, the field of display devices for processing and displaying information has grown rapidly. Thus, various display devices have been developed and have drawn attention.

Specific examples of display devices include a Liquid Crystal Display (LCD) device, a Plasma Display Panel (PDP) device, a Field Emission Display (FED) device, and an Organic Light Emitting Diode (OLED). Such displays demonstrate excellent performance, such as thinning, weight lightening, and low power consumption. Thus, currently, application fields of the display device continue to increase. In particular, the display device has been used as a user interface in most electronic devices or mobile devices.

Further, in recent years, a transparent display device which enables a user to see an object or an image positioned on the opposite side through a display device has been actively studied.

The transparent display device has advantages in terms of space efficiency, interior decoration, and design. Further, the transparent display device can be applied to various fields. The transparent display device can resolve spatial and visual constraints of conventional electronic devices by realizing a display device capable of recognizing information, processing information, and displaying information in a transparent electronic device. The transparent display device can be used in a smart window, and the smart window can be applied to be used in a smart home or smart vehicle.

Particularly, an LCD may be realized as a transparent display device using an edge-type backlight, but a transparent display device using the LCD exhibits a very low transmittance ratio. Also, the transparent display device using the LCD has a disadvantage in that transparency is reduced by a polarizer used for realizing black and outside visibility is negatively affected as well.

Further, a transparent display device using an OLED has higher power consumption than the transparent display device using an LCD. Also, a transparent display device has difficulty in expressing true black, but does not have a problem with a contrast ratio in a dark environment. However, it has a disadvantage of reduction in a contrast ratio in a normal environment with light.

Therefore, in order to realize a transparent mode and a light shielding mode, there has been suggested a method of using polymer dispersed liquid crystal (PDLC) or polymer networked liquid crystal (PNLC) formed into a single layer together with a light controlling apparatus of the transparent display device using an OLED. The polymer dispersed liquid crystal (PDLC) or polymer networked liquid crystal (PNLC) can be formed by mixing a monomer and a liquid crystal and irradiating ultraviolet (UV) rays to the mixture.

Particularly, the polymer dispersed liquid crystal (PDLC) has a structure in which a liquid crystal is formed within a polymer, and the polymer networked liquid crystal (PNLC) has a structure in which a polymer is distributed in a network structure on a liquid crystal.

If an electric field is applied to the polymer dispersed liquid crystal (PDLC) or polymer networked liquid crystal (PNLC), alignment of the liquid crystal is changed, and, thus, light incident from the outside can be scattered or transmitted. That is, a device using the polymer dispersed liquid crystal (PDLC) or polymer networked liquid crystal (PNLC) can scatter or transmit light without using a polarizer, and, thus, can be used as a light controlling apparatus of a transparent display device.

SUMMARY OF THE INVENTION

Accordingly, the present invention is directed to a light controlling apparatus and display device including the same, which substantially obviate one or more problems due to limitations and disadvantages of the related art.

An object of the present invention is to provide a light controlling apparatus and display device including the same, which may be reduced in power consumption by transmitting light incident from the outside in an initial state where a voltage is not applied and thus realizing a transparent mode in the initial state.

Further, another object of the present invention is to provide a light controlling apparatus and display device including the same, which may be capable of displaying a color by shielding or scattering light incident from the outside or keeping a background of the device from being visible.

Furthermore, yet another object of the present invention is to provide a light controlling apparatus including both of a network and a wall in a liquid crystal unit.

Also, still another object of the present invention is to provide a light controlling apparatus that has a high image visibility by providing a transparent mode or a light shielding mode in which an external light is blocked as being combined with a transparent display device.

Further, still another object of the present invention is to provide a light controlling apparatus that can be applied to a flexible display device.

The objects of the present invention are not limited to the aforementioned objects, and other objects, which are not mentioned above, will be apparent to a person having ordinary skill in the art from the following description.

According to an aspect of the present invention to achieve the above-described objects, there is provided a light controlling apparatus including: a first electrode unit and a second electrode unit facing each other; a liquid crystal unit between the first electrode unit and the second electrode unit, the liquid crystal unit including a liquid crystal; a wall having a first polymer being polymerized from a first monomer, the first monomer having a higher diffusion speed than a second monomer; and a network having a second polymer being polymerized from the second monomer, the second monomer having a lower diffusion speed than the first monomer.

According to another feature of the present invention, the light controlling apparatus further comprises a spacer on at least one among the first electrode unit and the second electrode unit.

According to yet another feature of the present invention, each of the first polymer and the second polymer is polymerized from at least one monomer among UV-curable monomers, polydimethylsiloxane, RM (reactive mesogen)-based monomers, NOA (Norland Optical Adhesive)-based monomers, bisphenol A dimethacrylate-based monomers, and photo resist.

According to still another feature of the present invention, if the first monomer is cured under a first curing condition, the second monomer is cured under a second curing condition different from the first curing condition.

According to still another feature of the present invention, if the first monomer is cured by UV curing, the second monomer is cured by thermal curing.

According to still another feature of the present invention, if the first monomer is cured by UV curing, the second monomer is cured by UV curing at a wavelength range different from that of the first monomer.

According to still another feature of the present invention, if the liquid crystal includes one among a negative type liquid crystal or a DFLC (dual frequency liquid crystal), each of the first electrode unit and the second electrode unit comprises a common electrode.

According to still another feature of the present invention, the light controlling apparatus exhibits a transparent mode with the liquid crystal in a homeotropic state when a voltage is not applied, and the light controlling apparatus exhibits a light shielding mode with the liquid crystal in a random state when a voltage is applied.

According to still another feature of the present invention, if the liquid crystal includes one among a positive type liquid crystal or a DFLC (dual frequency liquid crystal), at least one among the first electrode unit and the second electrode unit includes at least one patterned electrode.

According to still another feature of the present invention, a horizontal electric field is applied to the patterned electrode.

According to still another feature of the present invention, the light controlling apparatus exhibits a transparent mode with the liquid crystal in a homeotropic state when a voltage is not applied, and the light controlling apparatus exhibits a light shielding mode with the liquid crystal in a random state when a voltage is applied.

According to still another feature of the present invention, if the liquid crystal includes one among a positive type liquid crystal or a DFLC (dual frequency liquid crystal), at least one among the first electrode unit and the second electrode unit includes at least one patterned electrode and a common electrode.

According to still another feature of the present invention, a horizontal electric field is applied to the patterned electrode and the common electrode.

According to still another feature of the present invention, the light controlling apparatus exhibits a transparent mode with the liquid crystal in a homeotropic state when a voltage is not applied, and the light controlling apparatus exhibits a light shielding mode with the liquid crystal in a random state when a voltage is applied.

According to still another feature of the present invention, the light controlling apparatus further comprises an alignment member in the liquid crystal unit and configured to vertically align the liquid crystal, wherein the light controlling apparatus exhibits a transparent mode when a voltage is not applied.

According to another aspect of the present invention to achieve the above-described objects, there is provided a method of fabricating a light controlling apparatus, including: laminating a first electrode unit to a second electrode unit; forming a mixed liquid crystal unit between the first electrode unit and the second electrode unit, the mixed liquid crystal unit having a mixed liquid crystal, and the mixed liquid crystal having a first monomer, a second monomer and a liquid crystal; positioning a mask having a pattern on the first electrode unit or on the second electrode unit; forming a wall in a region corresponding to the pattern by polymerizing the first monomer by primary curing of the mixed liquid crystal, the first monomer having a higher diffusion speed than that of the second monomer; and forming a network by polymerizing the second monomer by secondary curing of the mixed liquid crystal, the second monomer having a lower diffusion speed than that of the first monomer.

According to another feature of the present invention, the method further comprises disposing a spacer on at least one among the first electrode unit and the second electrode unit.

According to still another feature of the present invention, the primary curing includes a first curing condition and the secondary curing includes a second curing condition different from the first curing condition.

According to yet another feature of the present invention, the primary curing includes a wavelength within a range of 360 nm to 380 nm, and the secondary curing includes a wavelength within a range of 330 nm to 360 nm.

According to still another feature of the present invention, the primary curing includes UV irradiation, and the secondary curing includes thermal treatment.

According to still another feature of the present invention, the primary curing includes UV irradiation, and a wavelength range of the secondary curing is different from that of the primary curing.

According to yet another aspect of the present invention to achieve the above-described objects, there is provided a mixed liquid crystal in which a liquid crystal, a first monomer and a second monomer are dispersed, comprising: the first monomer which is configured to be polymerized by initial curing due to a higher diffusion speed than that of the second monomer so as to form a wall for a light controlling apparatus; and the second monomer which is configured to be polymerized by subsequent curing due to a lower diffusion speed than that of the first monomer so as to form a network for a the light controlling apparatus.

According to another feature of the present invention, the light controlling apparatus exhibits a transparent mode with the liquid crystal in a homeotropic state when a voltage is not applied, and the light controlling apparatus exhibits a light shielding mode with the liquid crystal in a random state when a voltage is applied.

According to yet another feature of the present invention, the first monomer and the second monomer are cured by UV irradiation at different wavelength ranges.

According to still another feature of the present invention, a ratio of the first monomer to the second monomer includes 1:1 to 1:1.25 or 1:1 to 2.5:1.

According to still another feature of the present invention, the first monomer includes a UV curable monomer and the second monomer includes a UV curable monomer or a thermally curable monomer.

According to still another feature of the present invention, the liquid crystal includes one among a positive type liquid crystal, a negative type liquid crystal, and a DFLC (dual frequency liquid crystal).

According to yet another aspect of the present invention to achieve the above-described objects, there is provided a display device comprising: a display panel; and at least one light controlling apparatus attached to the display panel.

According to another feature of the present invention, the display panel is an OLED panel.

According to yet another feature of the present invention, the light controlling apparatus is attached to the front surface of the display panel.

According to still another feature of the present invention, the light controlling apparatus is attached to the rear surface of the display panel.

Details of other exemplary embodiments will be included in the detailed description of the invention and the accompanying drawings.

The present invention can provide a light controlling apparatus that can be driven in a transparent mode by transmitting light incident from the outside without applying a voltage.

Further, since the light controlling apparatus of the present invention has a state alignment that transmits light incident from the outside in an initial state, the transparent mode can be realized in the initial state. Therefore, it is possible to provide the light controlling apparatus reduced in power consumption.

Furthermore, the present invention can provide the light controlling apparatus that can be implemented in a light shielding mode in which a background of the light controlling apparatus is invisible by comprising a coloring member including a dye having a color so as to express black or other colors than black.

Also, the present invention can provide the light controlling apparatus including both of a wall and a network in a light shielding unit using two or more different monomers.

Further, the present invention can improve an effect of scattering light incident from the outside using the network in a liquid crystal unit.

Furthermore, the present invention can improve a light shielding rate of the light controlling apparatus by using the wall in the liquid crystal unit to suppress coloring members from being tilted to a specific region and thus to suppress light leakage caused by coloring members distributed in a non-uniform manner within the liquid crystal unit.

Also, the present invention can be applied to a flexible display device since a shock applied from the outside can be absorbed using the wall in the liquid crystal unit.

Further, the present invention can improve transmittance ration of the light controlling apparatus while being driven in a transparent mode by reducing a difference in refractive index. A refractive index matching layer disposed between the alignment member and the liquid crystal unit or between the electrode unit and the liquid crystal unit can be used.

Furthermore, the present invention can increase driving reliability by preventing a short occurring in the light controlling apparatus through the wall or the refractive index matching layer.

The effects of the present invention are not limited to the aforementioned effects, and other various effects are included in the following description.

BRIEF DESCRIPTION OF THE DRAWINGS

The above and other aspects, features and other advantages of the present invention will be more clearly understood from the following detailed description taken in conjunction with the accompanying drawings, in which:

FIG. 9b is a cross-sectional view of the display device taken along a line IX-IX' of FIG. 9a.

FIG. 10b is a cross-sectional view of the display device taken along a line X-X' of FIG. 10a.

DETAILED DESCRIPTION OF THE INVENTION

Figure 1:
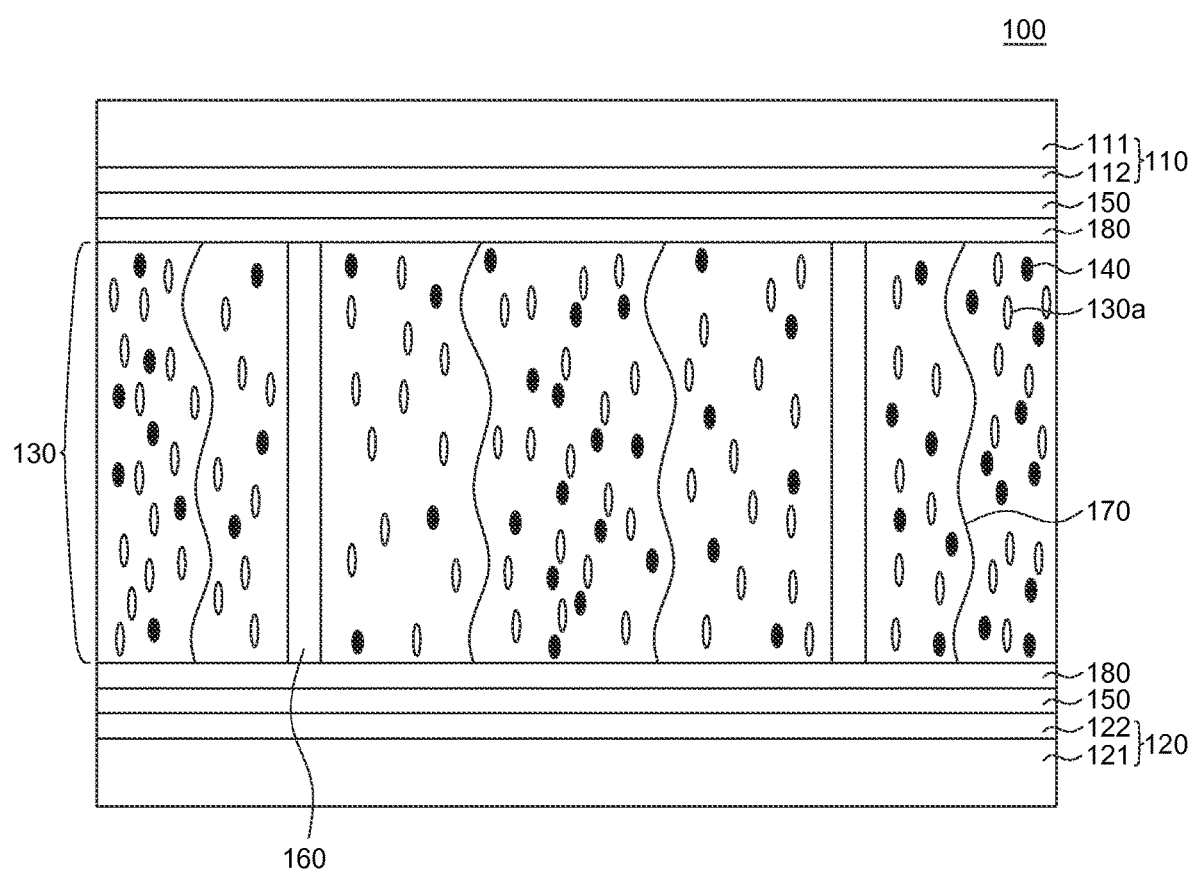
FIG. 1 is a cross-sectional view illustrating a light controlling apparatus according to an exemplary embodiment of the present invention.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like shown in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "containing" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly".

When the relation in order of time is described using the terms such as "after", "subsequent to", "next to", "before" and the like, discontinuous relations may be included unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

"X-axis direction", "Y-axis direction", and "Z-axis direction" should not be construed only as being in a geometric relationship in which these directions are perpendicular to each other, but may have a wider directionality in a range to which the configuration of the present invention can be functionally applied.

The term "at least one" should be understood as including all possible combinations which can be suggested from one or more relevant items. For example, the meaning of "at least one among a first item, a second item, and a third item" may be each one among the first item, the second item, or the third item and also be all possible combinations which can be suggested from two or more of the first item, the second item, and the third item.

The features of various embodiments of the present invention can be partially or entirely laminated to or combined with each other and can be interlocked and operated in technically various ways as can be fully understood by a person having ordinary skill in the art, and the embodiments can be carried out independently of or in association with each other.

Hereinafter, exemplary embodiments of the present invention will be described in detail with reference to the accompanying drawings.

Polymer dispersed liquid crystal (PDLC) and polymer networked liquid crystal (PNLC) used as a light controlling apparatus of a transparent display device have a different mixing ratio of monomers and a liquid crystal. Generally, the PDLC has a higher percentage of monomers than the PNLC. Therefore, the PDLC realizes a light shielding mode in which an incident light is scattered by a randomly aligned liquid crystal and polymerized monomers in an initial state where a voltage is not applied. Also, the PDLC realizes a transparent mode by transmitting an incident light without scattering when a voltage is applied and thus the liquid crystal is vertically aligned. If the PDLC is used as a light controlling apparatus of a transparent display device, a voltage needs to be continuously applied for realizing the transparent mode in a standby.

Accordingly, the inventors of the present invention conducted an experiment on the PNLC which is advantageous in realizing the transparent mode in the initial state where a voltage is not applied since the percentage of monomers is relatively low. However, the PNLC has a lower percentage of polymerized monomers than the PDLC, and, thus, has a low resistance to an external shock. Therefore, a wall for resisting the external shock is needed. However, it is recognized that if a wall is formed, it is difficult to form a network. If a network is formed, it is difficult to form a wall.

Thus, the inventors of the present invention recognized the above-described problems, and invented a light controlling apparatus having a new structure in which a wall and a network are formed so as to realize a transparent mode and a light shielding mode.

Details thereof will be described with reference to the following exemplary embodiments.

Figure 2:
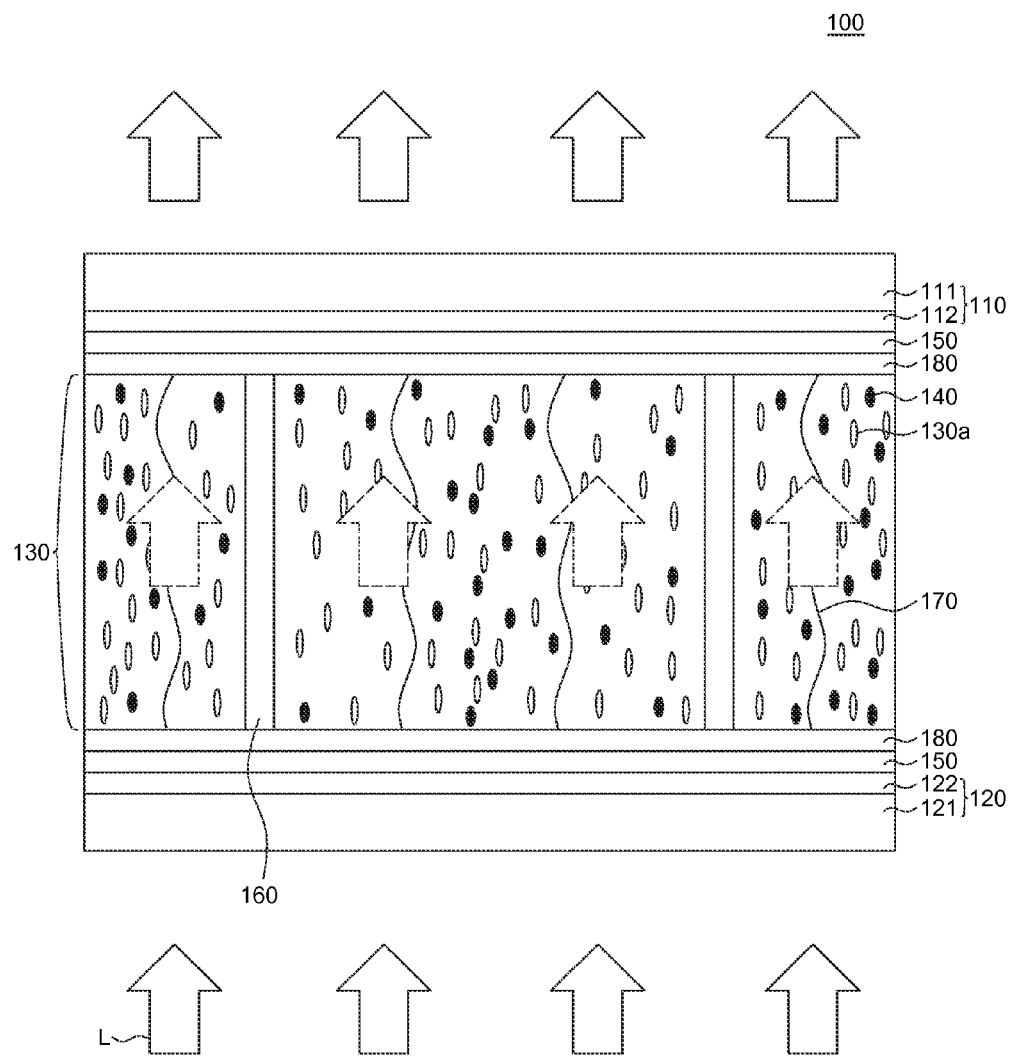
FIG. 2 is a cross-sectional view illustrating a transparent mode of the light controlling apparatus illustrated in FIG. 1.
Figure 3:
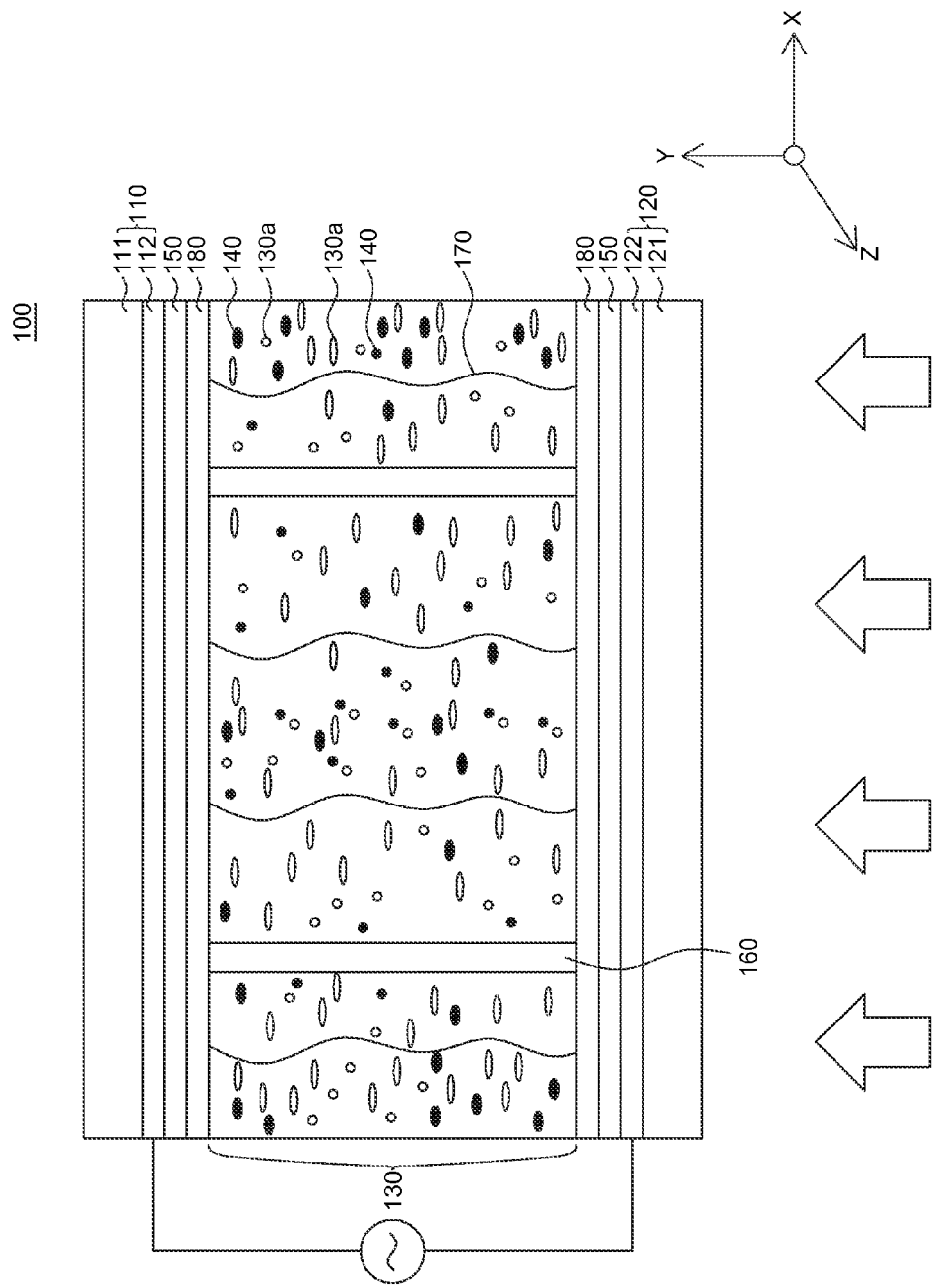
FIG. 3 is a cross-sectional view illustrating a light shielding mode of the light controlling apparatus illustrated in FIG. 1.

FIG. 1 is a cross-sectional view illustrating a light controlling apparatus according to an exemplary embodiment of the present invention, FIG. 2 is a cross-sectional view illustrating a transparent mode of the light controlling apparatus illustrated in FIG. 1 and FIG. 3 is a cross-sectional view illustrating a light shielding mode of the light controlling apparatus illustrated in FIG. 1. As illustrated in FIG. 1, a light controlling apparatus 100 according to an exemplary embodiment of the present invention includes a first electrode unit 110, a second electrode unit 120, a liquid crystal unit 130, a coloring member 140, an alignment unit 150, a wall 160, a network 170, a refractive index matching layer 180, and a spacer.

Referring to FIG. 1, the first electrode unit 110 includes a first substrate 111 and a first electrode 112. To be more specific, the first electrode unit 110 includes the first substrate 111 formed of a transparent material and the first electrode 112 positioned on the first substrate 111. The first substrate 111 may use, without limitation, a substrate used in a general display device or flexible display device. To be specific, the first substrate 111 may be formed of transparent glass-based materials or transparent plastic-based materials. Sheets or films having cellulose resin such as TAC (triacetyl cellulose) or DAC (diacetyl cellulose), a COP (cyclo olefin polymer) such as norbornene derivatives, COC (cyclic olefin copolymer), acrylic resin such as PMMA (poly(methylmethacrylate), polyolefin such as PC (polycarbonate), PE (polyethylene), or PP (polypropylene), polyester such as PVA (polyvinyl alcohol), PES (poly ether sulfone), PEEK (polyetheretherketone), PEI (polyetherimide), PEN (polyethylenenaphthalate), or PET (polyethyleneterephthalate), PI (polyimide), PSF (polysulfone), or fluoride resin may be used as the first substrate 111, but the present invention is not limited thereto.

The first electrode 112 is disposed on one surface of the first substrate 111, and has a shape without a pattern. The first electrode 112 may be formed of a transparent conductive material which has conductivity and also transmits an external light. For example, the first electrode 112 may be formed of a material at least one among silver oxide (e.g.; AgO or $Ag_2O$ or $Ag_2O_3$), aluminum oxide (e.g.; $Al_2O_3$), tungsten oxide (e.g.; $WO_2$ or $WO_3$ or $W_2O_3$), magnesium oxide (e.g.; MgO), molybdenum oxide (e.g.; $MoO_3$), zinc oxide (e.g.; ZnO), tin oxide (e.g.; $SnO_2$), indium oxide (e.g.; $In_2O_3$), chromium oxide (e.g.; $CrO_3$ or $Cr_2O_3$), antimony oxide (e.g.; $Sb_2O_3$ or $Sb_2O_5$), titanium oxide (e.g.; $TiO_2$), nickel oxide (e.g.; NiO), copper oxide (e.g.; CuO or $Cu_2O$), vanadium oxide (e.g.; $V_2O_3$ or $V_2O_5$), cobalt oxide (e.g.; CoO), iron oxide (e.g.; $Fe_2O_3$ or $Fe_3O_4$), niobium oxide (e.g.; $Nb_2O_5$), indium tin oxide (e.g.; Indium Tin Oxide, ITO), indium zinc oxide (e.g.; Indium Zinc Oxide, IZO), aluminum doped zinc oxide (e.g.; Aluminum doped Zinc Oxide, ZAO), aluminum doped tin oxide (e.g.; Aluminum Tin Oxide, TAO), and antimony tin oxide (e.g.; Antimony Tin Oxide, ATO), but is not limited thereto.

The second electrode 120 includes a second substrate 121 and a second electrode 122. To be more specific, the second electrode unit 120 includes the second substrate 121 formed of a transparent material and the second electrode 122 positioned on the second substrate 121. Shapes and materials of the second substrate 121 and the second electrode 122 of the second electrode unit 120 may be identical to those of the first substrate 111 and the first electrode 112 of the first electrode unit 110.

The alignment member 150 is configured to align the liquid crystal unit 130 in a homeotropic state as an initial state and is formed of a vertical alignment material. In the present specification, the homeotropic state refers to a state where a liquid crystal 130a is aligned perpendicularly to the first electrode unit 110 and the second electrode unit 120.

The alignment member 150 may be positioned on or under the liquid crystal unit 130. To be specific, the alignment member 150 may include a first alignment film formed in the first electrode 112 constituting the first electrode unit 110 and a second alignment film formed in the second electrode 122 constituting the second electrode unit 120.

The alignment member 150 may be formed of at least one among polyimide-based materials and phosphatidylcholine (PPC)-based materials, but is not limited thereto. In addition, the alignment member 150 may be formed by mixing HTAB (hexadecyltrimethylammonium bromide) or CTAB (cetyl trimethyl ammonium bromide) in a solvent such as isopropyl alcohol (IPA). Then, the alignment unit 130 can be formed by coating the mixture on the first electrode 112 and the second electrode 122 and then evaporating the solvent.

Although FIG. 1 illustrates that the alignment member 150 is positioned on and under the liquid crystal unit 130, the alignment member 150 may be positioned any one among either on or under the liquid crystal unit 130.

The refractive index matching layer 180 is disposed within the light controlling apparatus 100. That is, referring to FIG. 1, the refractive index matching layer 180 is disposed between the alignment member 150 and the liquid crystal unit 130. In addition, the refractive index matching layer 180 may be disposed between the first electrode unit 110 and the alignment member 150 and between the second electrode unit 120 and the alignment member 150.

The refractive index matching layer 180 may be formed of any one among a polymer, an OCA (optical clear adhesive) as one among optical transparent adhesives, and an organic compound adhesive such as a thermal or UV curable organic polymer compound, and has a refractive index of 1.3 to 1.9. The first electrode unit 110 and the second electrode unit 120 constituting the light controlling apparatus 100 of the present invention may have a refractive index in the range of 1.6 to 1.8. Also, the liquid crystal unit 130 may have a refractive index in the range of 1.3 to 1.6.

Herein, if the refractive index matching layer 180 is not provided within the light controlling apparatus 100, when light is incident into the light controlling apparatus 100, fresnel reflection may occur due to a difference in refractive index between the first and second electrodes 110 and 120 and the liquid crystal unit 130.

To be more specific, if the light controlling apparatus 100 exhibits a transparent mode while light proceeds into the light controlling apparatus 100, when the light passing through the second electrode unit 120 is incident into the liquid crystal unit 130, a considerable amount of light may be reflected to the outside of the liquid crystal unit 130. Then, when the light passing through the liquid crystal unit 130 passes through the first electrode unit 110 again, a considerable amount of the light may be reflected again to the inside of the liquid crystal unit 130 due to a difference in refractive index between the first electrode unit 110 and the liquid crystal unit 130. As such, if the light controlling apparatus 100 exhibits a transparent mode, a considerable amount of the light cannot pass through the light controlling apparatus 100 but may be reflected due to fresnel reflection. Thus, transparency may be decreased.

Meanwhile, if the refractive index matching layer 180 is disposed between the alignment member 150 and the liquid crystal unit 130 according to an exemplary embodiment of the present invention, while light passes through the light controlling apparatus 100, fresnel reflection may hardly occur. That is, a difference in refractive index between the first electrode unit 110 and the liquid crystal unit 130 and a difference in refractive index between the second electrode unit 120 and the liquid crystal unit 130 may be reduced by the refractive index matching layer 180.

Therefore, while light the light controlling apparatus 100 is in a transparent mode, light incident from the outside can pass through the inside of the light controlling apparatus 100 without any loss. Thus, it is possible to provide a high transparency to a user.

Further, as described above, as described above, since the refractive index matching layer 180 may be formed of at least one among a polymer, an OCA (optical clear adhesive) as one among optical transparent adhesives, and an organic compound adhesive such as a thermally or UV curable organic polymer compound, it is possible to prevent a short which may occur within the light controlling apparatus 100. To be more specific, if a physical pressure is applied to the light controlling apparatus 100, the first electrode unit 110 and the second electrode unit 120 are brought into contact with each other. Thus, a short may occur in the light controlling apparatus 100. Further, a micro impurity generated during a fabricating process of the light controlling apparatus 100 may be mixed with the liquid crystal 130a in the liquid crystal unit 130. The impurity may serve as a conductor that enables electric connection between the first electrode unit 110 and the second electrode unit 120 in the liquid crystal unit 130. Thus, a short may occur between the first electrode unit 110 and the second electrode unit 120 in the light controlling apparatus 100.

However, since the refractive index matching layer 180 according to an exemplary embodiment of the present invention is formed of the above-described material, it can serve as an insulator. Therefore, the refractive index matching layer 180 can prevent occurrence of a short within the light controlling apparatus 100 and thus can increase the reliability of the light controlling apparatus 100.

However, the refractive index matching layer 180 is not necessarily included in the light controlling apparatus 100, but may be optionally employed in the light controlling apparatus 100.

The liquid crystal unit 130 is positioned between the first electrode unit 110 and the second electrode unit 120. To be specific, referring to FIG. 1, the liquid crystal unit 130 is between the refractive index matching layers 180.

The liquid crystal unit 130 includes the liquid crystal 130a, the wall 160 and the network 170. The liquid crystal 130a may be at least one among a negative type liquid crystal or a DFLC (dual frequency liquid crystal). A driving method of the light controlling apparatus 100 depending on a kind of the liquid crystal 130a will be described later.

The coloring member 140 is positioned in the liquid crystal unit 130 and mixed with the liquid crystal 130a in the liquid crystal unit 130. If an electric field is applied to the liquid crystal unit 130 and a state of the liquid crystal 130a is changed, alignment of the coloring member 140 is also changed according to the change in state of the liquid crystal 130a adjacent to the coloring member 140.

The coloring member 140 may be formed of a dye having at least one color of black, red, green, blue, and yellow or a combination color thereof. For example, if the light controlling apparatus 100 is combined with a rear surface of a transparent display panel constituting a display device, while images are realized, light incident from the rear surface needs to be shielded in order to improve image visibility. In this case, the coloring member 140 may be formed of a dye having a black color. In addition, a color to be held in the coloring member 140 can be selectively changed depending on a place or purpose of use of the light controlling apparatus 100. Thus, it is possible to provide an aesthetic effect to the user.

As illustrated in FIG. 1, the wall 160 is positioned between the first electrode unit 110 and the second electrode unit 120, i.e., within the liquid crystal unit 130. A position of the 160 within the light controlling apparatus 100 can be freely changed.

The wall 160 may be formed of a UV curable monomer formed of a transparent material that transmits light. To be more specific, if the wall 160 is formed of a UV curable monomer, the UV curable monomer may be a monomer reactive at a UV wavelength range of 330 nm to 360 nm or a UV wavelength range of 360 nm to 380 nm. Otherwise, the wall 160 may be formed of a polymer polymerized from at least one monomer among, for example, photo resist formed of a transparent material that transmits light, polydimethylsiloxane, UV curable monomers, RM (Reactive Mesogen)-based monomers, NOA (Norland Optical Adhesive)-based monomers, and Bisphenol A Dimethacrylate-based monomers, but is not limited thereto. However, if the network 170 to be described later is formed of a UV curable monomer, a UV curable monomer for forming the wall 160 is a monomer reactive at a different wavelength range from the UV curable monomer for forming the network 170. That is, the UV curable monomer for forming the wall 160 is cured at a different wavelength range from the UV curable monomer for forming the network 170. Herein, an RM (Reactive Mesogen)-based monomer may be a material having a rod-like liquid crystalline state. An end group of an RM (Reactive Mesogen)-based monomer can be polymerized with ultraviolet (UV) rays or heat. An end group which can be polymerized with UV may be at least one among acrylate, ethylene, acetylene, and styrene, but is not limited thereto. Further, an end group which can be polymerized with heat may be at least one among oxetane or epoxy, but is not limited thereto.

The wall 160 formed of a UV curable monomer can protect the inside of the liquid crystal unit 130 against an external force. Therefore, the light controlling apparatus 100 including the above-described wall 140 can be applied to a flexible transparent display device. Further, the wall 160 can prevent a short caused by a contact between the first electrode unit 110 and the second electrode unit 120. Furthermore, the wall 160 can separate spaces, and the liquid crystal 130a may be formed in each space defined by the wall 160.

Since the wall 160 is formed within the liquid crystal unit 130, it is possible to prevent the concentration of the coloring 250 included in the liquid crystal unit 130 to a specific region. To be more specific, the inside of the liquid crystal unit 130 is divided into several sections (or regions) by the wall 160, and the coloring member 140 positioned in each section cannot be moved to another section. If the wall 160 is not present within the liquid crystal unit 130, the coloring member 140 may be freely moved in the liquid crystal unit 130 depending on an external pressure or a state at a position of the light controlling apparatus 100. Therefore, in a state where the coloring member 140 is not uniformly distributed in the liquid crystal unit 130, if the light controlling apparatus 100 exhibits a light shielding mode, light leakage may occur at some regions. However, as described in the exemplary embodiment of the present invention, a structure in which the wall 160 is disposed in the liquid crystal unit 130 and the coloring member 140 is positioned in a section formed by the wall 160, movement of the coloring member 140 is very limited. Also, the light controlling apparatus 100 can be exhibit in a light shielding mode in an overall uniform manner. Thus, in the light shielding mode of the light controlling apparatus 100, light shielding ratio can be improved.

A weight ratio of the coloring member 140 can be determined depending on a kind of a display device to which the light controlling apparatus 100 is applied. For example, if the light controlling apparatus 100 is a transparent display device placed indoors, it is important that the light controlling apparatus 100 has a high transmittance ratio in a transparent mode. Therefore, preferably, the coloring member 140 may have a relatively low weight ratio. Further, if the light controlling apparatus 100 is a transparent display device placed outdoors, it is important that the light controlling apparatus 100 has a high light shielding ratio in a light shielding mode. Therefore, preferably, the coloring member 140 may have a relatively high weight ratio. In some exemplary embodiments, the coloring member 140 may have a weight ratio of 1 wt %, but is not limited thereto.

The network 170 is positioned in a polymer networked form in the liquid crystal unit 130. The network 170 is formed of a UV curable monomer formed of a transparent material or a thermally curable monomer formed of a transparent material that transmits light.

If the network 170 is formed of a UV curable monomer, the UV curable monomer may be a monomer reactive at a UV wavelength range of 330 nm to 360 nm or a UV wavelength range of 360 nm to 380 nm. Otherwise, the network 170 may be formed of a polymer polymerized from at least one monomer among, for example, photo resist formed of a transparent material that transmits light, polydimethylsiloxane, UV curable monomers, RM (Reactive Mesogen)-based monomers, NOA (Norland Optical Adhesive)-based monomers, and Bisphenol A Dimethacrylate-based monomers, but is not limited thereto.

However, if the wall 160 is formed of a UV curable monomer, the monomer for forming the wall 160 and the monomer for forming the network 170 may be reactive to light at different wavelength ranges. For example, the wall 160 may be formed using the UV curable monomer cured at a UV wavelength range of 360 nm to 380 nm, and the network 170 may be formed using the UV curable monomer cured at a UV wavelength range of 330 nm to 360 nm.

Meanwhile, if the network 170 is formed of a thermally curable monomer while the wall 160 is formed of a UV curable monomer, the monomer for forming the network 170 may be a monomer reactive to heat provided by a manufacturing apparatus such as a hot plate. A monomer may use a monomer thermally cured at, for example, room temperature (20° C.±5° C.) to 50° C. or 50° C. to 80° C., but is not limited thereto.

Further, in order to minimize distortion caused by a difference in refractive index, the UV curable monomer or thermally curable monomer for forming the network 170 needs to have a refractive index in the same range as a refractive index in a direction of a minor axis of the liquid crystal 130a in the liquid crystal unit 130. For example, if the liquid crystal unit 130 includes the liquid crystal 130a having a refractive index of 1.4, a UV curable monomer having a refractive index of 1.4 may be selected so as to be used as a material of the network 170.

The network 170 formed of a UV curable monomer or thermally curable monomer in a polymer networked form within the liquid crystal unit 130 can improve a scattering effect by randomly aligning the liquid crystal 130a in a light shielding mode to be described later with reference to FIG. 3.

The monomer for forming the wall 160 has a low polymerization rate, and the monomer for forming the wall 160 has a higher diffusion speed than the monomer for forming the network 170. Thus, phase separation may easily occur. On the other hand, the monomer for forming the network 170 has a high polymerization rate, and the monomer for forming the network 170 has a lower diffusion speed than the monomer for forming the wall 160. Thus, phase separation does not easily occur. In the entire light controlling apparatus 100, the number of walls 160 is smaller than the number of networks 170. Further, the walls 160 are formed with a predetermined space therebetween in the light controlling apparatus 100, but a large number of the networks 170 are formed in the light controlling apparatus 100. Therefore, during a curing process for forming the wall 160, the monomer for forming the wall 160 needs to be rapidly moved to a position where the wall 160 should be formed. However, during a curing process for forming the network 170, the network 170 needs to be formed in the entire light controlling apparatus 100. Thus, the monomer for forming the network 170 needs to have a lower diffusion speed than the monomer for forming the wall 160. That is, it is possible to fabricate the light controlling apparatus 100 including both of the wall 160 and the network 170 using monomers different from each other in polymerization rate or diffusion speed.

In addition, the network 170 has a net-shaped structure in the liquid crystal unit 130. Thus, it can serve as a supporting structure between the first electrode unit 110 and the second electrode unit 120.

Although not illustrated in FIG. 1, the spacer may be positioned between the first electrode unit 110 and the second electrode unit 120. To be more specific, the spacer may be disposed on the first electrode unit 110, the second electrode unit 120 or both the first electrode unit 110 and the second electrode unit 120. The spacer may have a ball shape or an elongated shape, but a shape of the spacer is not limited thereto. The spacer is dispersed in a liquid crystal unit and determines the cell gap of the liquid crystal unit 130 and also supports the cell gap. The spacer may be formed of a silica ($SiO_2$)-based material.

To be more specific, during the fabricating process of the light controlling apparatus 100, after the first electrode unit 110 and the second electrode unit 120 are laminated to each other, the liquid crystal unit 130 is formed between the first electrode unit 110 and the second electrode unit 120. Further, the spacer is positioned between the first electrode unit 110 and the second electrode unit 120 in order to maintain the cell gap of the liquid crystal unit 130. Then, the first electrode unit 110 and the second electrode unit 120 are laminated to each other. At this time, the cell gap of the light controlling apparatus 100 is determined and a height of the above-described wall 160 is also determined depending on a size (height) and the number of the spacers.

Hereinafter, driving methods of a transparent mode and a light shielding mode of the light controlling apparatus 100 will be described with reference to FIG. 2 and FIG. 3.

As illustrated in FIG. 2, the liquid crystal 130a in the liquid crystal unit 130 of the light controlling apparatus 100 is in a homeotropic state as an initial state. Thus, the light controlling apparatus 100 is driven in a transparent mode in which light L incident from the outside is transmitted. Herein, the initial state includes a state where a voltage is not applied to the first electrode unit 110 and the second electrode unit 120 after the fabricating process of the light controlling apparatus 100 is completed, a state where an electric field is not formed between the first electrode unit 110 and the second electrode unit 120, or a state where there is no difference in voltage between the first electrode unit 110 and the second electrode unit 120.

In other words, since the liquid crystal 130a in the liquid crystal unit 130 is cured in a homeotropic state by the alignment member 150 formed of a vertical alignment material, the liquid crystal 130a in the liquid crystal unit 130 can maintain the homeotropic state in the initial state.

Therefore, since the light controlling apparatus 100 has a state alignment that transmits the light L incident from the outside in the initial state, the transparent mode can be realized in the initial state. Therefore, it is possible to reduce power consumption of the light controlling apparatus 100.

As illustrated in FIG. 3, since the liquid crystal 130a of the liquid crystal unit 130 is in a homeotropic state as an initial state, in order for the liquid crystal unit 130 to have a random state, it is necessary to make a difference in voltage between the first electrode unit 110 and the second electrode unit 120 and apply an electric field to the liquid crystal unit 130. In the present specification, the random state refers to a state where the liquid crystal 130a in the liquid crystal unit 130 is randomly aligned with respect to the first electrode unit 110 and the second electrode unit 120 or the first substrate 111 and the second substrate 121, as shown in FIG. 3. In other words, the state where the liquid crystal 130a is randomly aligned refers to a state where the liquid crystal 130a lies in an X-direction or a Z-direction according to an electric field on the basis of a coordinate system illustrated in FIG. 3.

To be specific, if the liquid crystal 130a is a negative liquid crystal, the minor axis of the liquid crystal 130a is moved in a direction to the electric field. Therefore, when a vertical electric field is formed by supplying voltages to the first electrode unit 110 and the second electrode unit 120, the liquid crystal 130a can be changed to be aligned from the homeotropic state to the random state. Herein, a difference in voltage applied to the first electrode unit 110 and the second electrode unit 120 is 5 V or more, but is not limited thereto.

Further, if the liquid crystal 130a is a DFLC of which a state is converted using a frequency, voltages having predetermined frequencies are applied to the first electrode unit 110 and the second electrode unit 120. For example, when certain driving voltages having frequencies of 10 KHz to 1 MHz are supplied, the liquid crystal 130a can be changed to be aligned from the homeotropic state to the random state. However, the frequency is not limited thereto.

Therefore, the liquid crystal unit 130 may have a random state that can scatter light incident from the outside. Further, as illustrated in FIG. 3, the coloring member 140 is also changed in alignment according to the liquid crystal 130a. To be more specific, if light is scattered in a state where the liquid crystal unit 130 does not include the coloring member 140 therein, an opaque milky color, for example, an opaque white- or gray-based color is displayed. As a result, light incident from the outside can be scattered. Further, the light incident from the outside can be further scattered through the network 170. However, the light controlling apparatus 100 according to an exemplary embodiment of the present invention includes the coloring member 140, which may be formed of a dye having a color, in the liquid crystal unit 130. Therefore, apart of the light scattered in the liquid crystal unit 130 may go out to the outside of the light controlling apparatus 100 but most of the light is finally scattered and absorbed by the coloring member 140. Therefore, the liquid crystal unit 130 displays a color held in the coloring member 140. Thus, the light incident from the outside can be shielded.

A method for converting the light shielding mode of the light controlling apparatus 100 to the transparent mode as illustrated in FIG. 2 is as follows. If the liquid crystal 130a in the liquid crystal unit 130 is a negative type liquid crystal, when the voltages supplied to the first electrode unit 110 and the second electrode unit 120 of the light controlling apparatus 100 are blocked, the liquid crystal 130a in the liquid crystal unit 130 is changed from the random state to the homeotropic state. Thus, the light controlling apparatus 100 is converted into the transparent mode.

Further, if the liquid crystal unit 130 is a DFLC, when the voltages supplied to the first electrode unit 110 and the second electrode unit 120 of the light controlling apparatus 100 are blocked or voltages having predetermined frequencies are supplied, the liquid crystal 130a in the liquid crystal unit 130 is changed from the random state to the homeotropic state. Thus, the light controlling apparatus 100 is converted into the transparent mode.

FIG. 4a to FIG. 4d are cross-sectional views illustrating various exemplary embodiments of an electrode unit of a light controlling apparatus. In the present exemplary embodiment, descriptions on components identical or corresponding to those of the above-described exemplary embodiment will be omitted.

As illustrated in FIG. 4a to FIG. 4d, at least one among the first electrode unit 110 or the second electrode unit 120 may include a plurality of patterned electrode. That is, at least one among a first electrode 112a of the first electrode unit 110 and a second electrode 122b of the second electrode unit 120 may include a plurality of patterned electrodes.

Figure 4A:
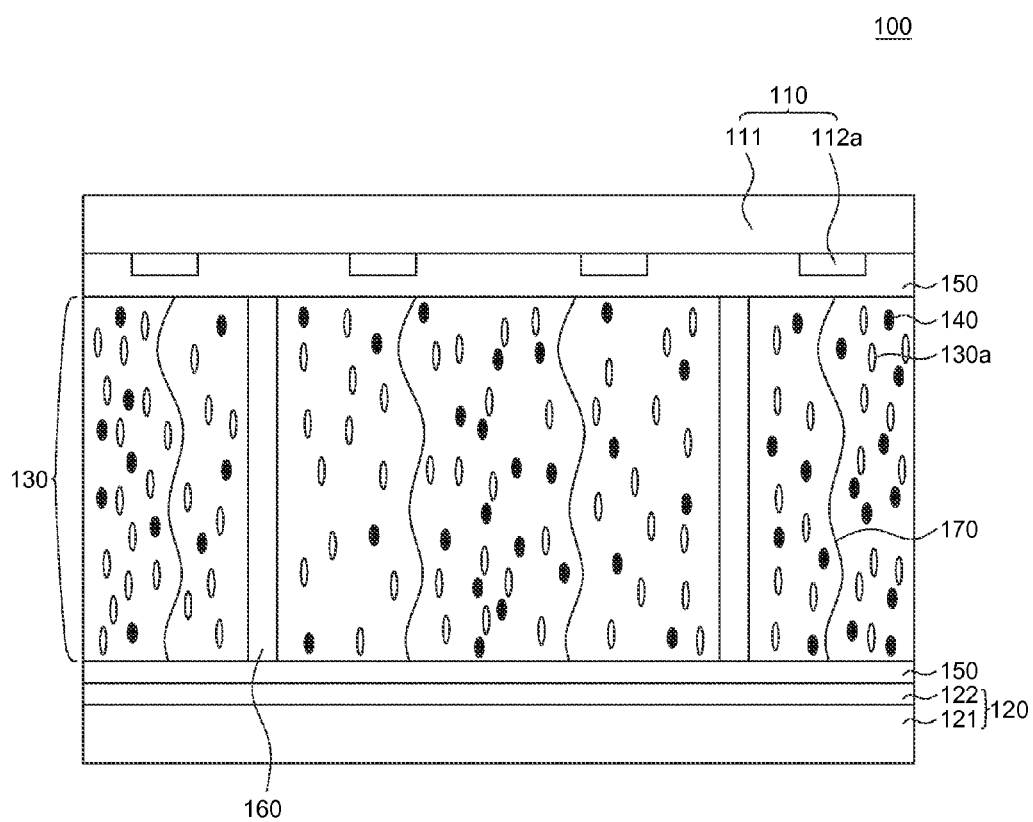
FIG. 4a to FIG. 4d are cross-sectional views illustrating various exemplary embodiments of an electrode unit.
Figure 4B:
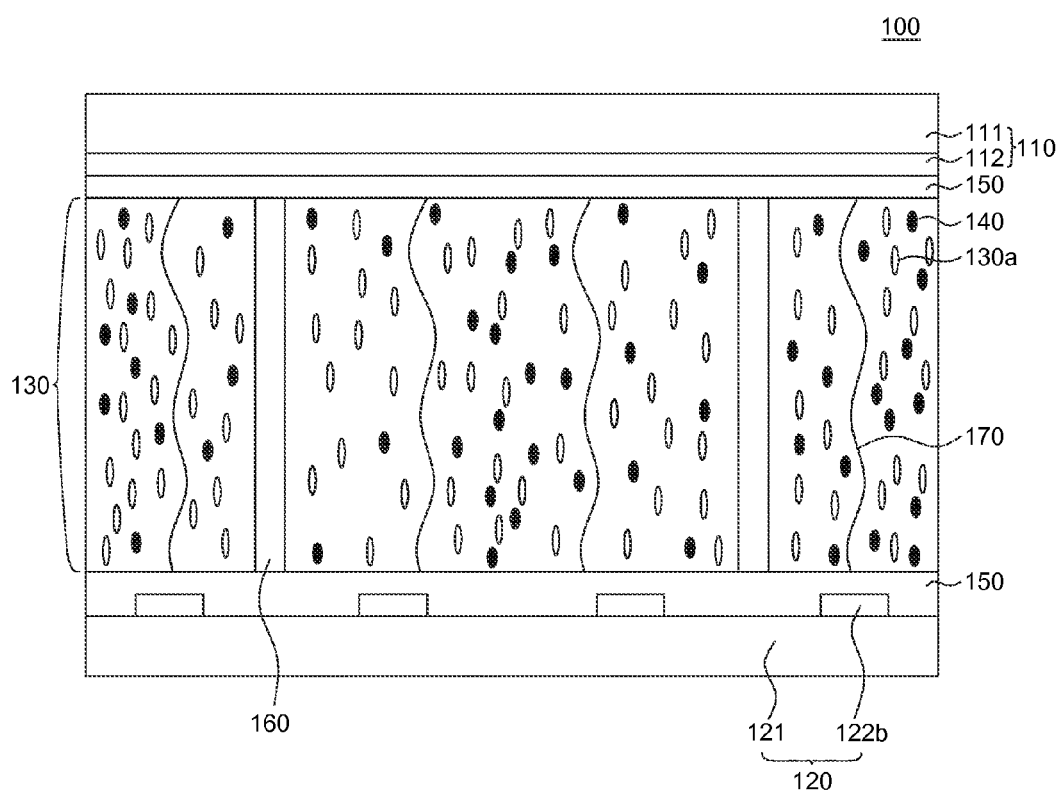

If the first electrode 112a of the first electrode unit 110 includes a plurality of patterned electrodes or the second electrode 122b of the second electrode unit 120 includes a plurality of patterned electrodes, the liquid crystals unit 130 may be a positive liquid crystal. If the liquid crystal 130a in the liquid crystal unit 130 is a positive type liquid crystal, a long axis of the liquid crystal 130a is moved in a direction to an electric field. Thus, a horizontal electric field needs to be formed by supplying voltages to the first electrode unit 110 and the second electrode unit 120. However, as illustrated in FIG. 1 to FIG. 3, if the first electrode unit 110 and the second electrode unit 120 include electrodes, a horizontal electric field cannot be formed. Thus, if the liquid crystal unit 130 is a positive type liquid crystal, the first electrode unit 110 or the second electrode unit 120 of the light controlling apparatus 100 needs to include a plurality of patterned electrodes as illustrated in FIG. 4a and FIG. 4d.

Herein, in order for the liquid crystal unit 130 to be converted from the transparent mode in a homeotropic state to the light shielding mode in a random state, a horizontal electric field may be formed by supplying voltages to an electrode unit including patterned electrodes among the first electrode unit 110 or the second electrode unit 120. That is, a horizontal electric field is applied to the patterned electrodes. For example, as illustrated in FIG. 4a, if the first electrode 112a of the first electrode unit 110 includes a plurality of patterned electrodes, each patterned electrode 112a is configured to be applied with a voltage having a different polarity from the adjacent patterned electrode 112a. For example, if a positive (+) voltage is applied to any one patterned electrode, a negative (−) voltage may be applied to a patterned electrode adjacent to the patterned electrode. That is, the odd-number patterned electrodes 112a are applied with the same voltage as the odd-number patterned electrodes 112a, and the even-number patterned number patterned electrodes 112a are applied with the same voltage as the even-number patterned electrodes 112a. Therefore, a voltage difference is formed between a plurality of the patterned electrodes 112a adjacent to each other. Thus, a horizontal electric field may be formed. Herein, a difference in voltage applied to the adjacent patterned electrodes is 5 V or more, but is not limited thereto. Further, the second electrode 122 of the second electrode unit 120 may be applied with the same voltage as one among a plurality of the patterned electrodes 112a. As illustrated in FIG. 4b, even if the second electrode 122b of the second electrode unit 120 includes a plurality of patterned electrodes, voltages may be applied in the same manner as described above.

Further, in order for the liquid crystal unit 130 to be converted from the light shielding mode in a random state to the transparent mode in a homeotropic state, a voltage may not be applied between the first electrode unit 110 and the second electrode unit 120.

Figure 4C:
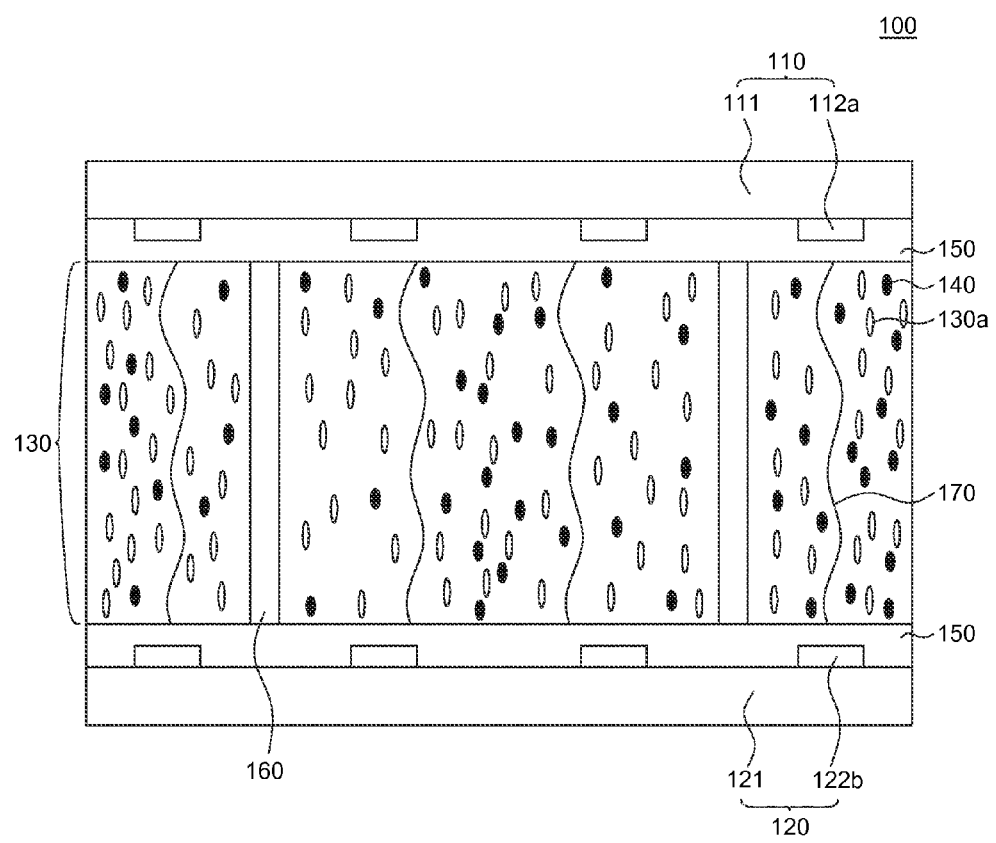
Figure 4D:
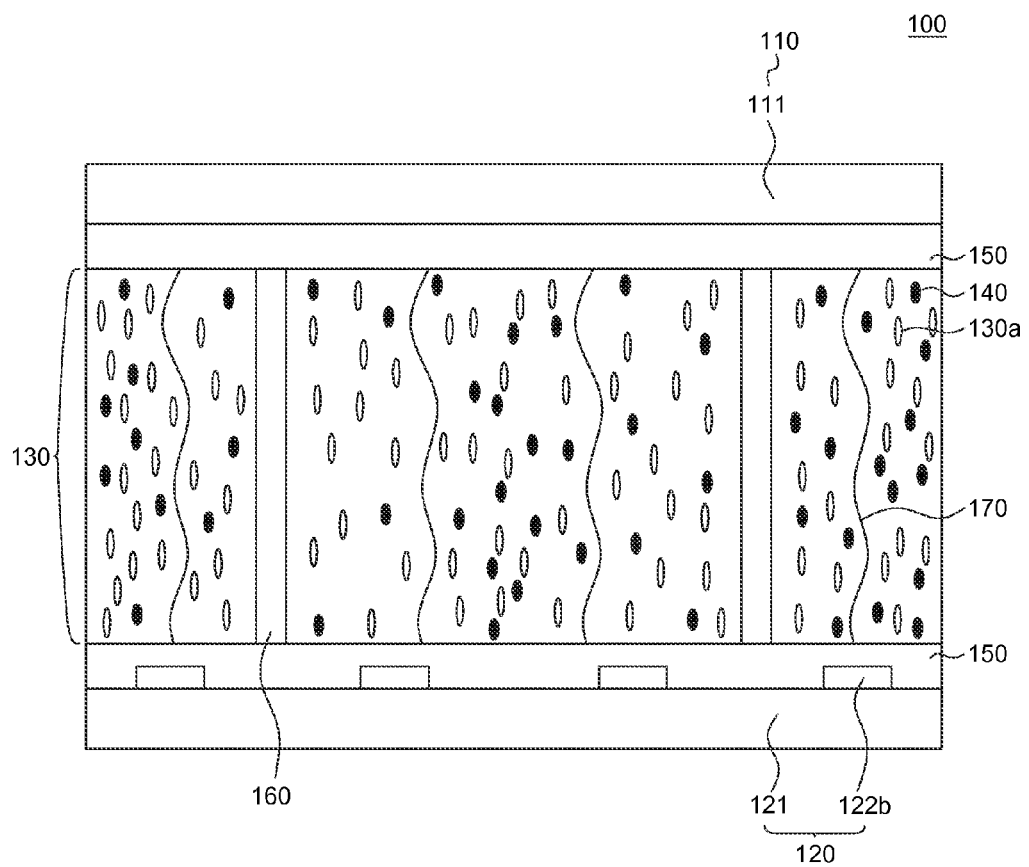

Herein, as illustrated in FIG. 4c, if both of the first electrode 112a and the second electrode 122b include patterned electrodes, when a horizontal electric field is applied to the first electrode 112a and the second electrode 122b, an electric field which can change a state of the liquid crystal 130a is generated. Thus, as illustrated in FIG. 4a and FIG. 4b, even if a low voltage is applied, it is possible to easily change from a homeotropic state to a random state as compared with a case where patterned electrodes are formed on only one side. A method of applying a horizontal electric field to the first electrode 112a and the second electrode 122b is the same as described above referring to FIG. 4a, and thus, the detailed descriptions thereof will be omitted. Therefore, if both of the first electrode 112a and the second electrode 122b include patterned electrodes, the light controlling apparatus 100 can be driven with a low voltage and a state can be more easily changed, and also, a time for converting a state can be reduced.

Otherwise, as illustrated in FIG. 4d, the first electrode unit 110 may include the first substrate 111 and the second electrode 122b of the second electrode unit 120 may include a patterned electrode. That is, as an electrode is not formed on one substrate and a patterned electrode is formed on the other substrate, the patterned electrode on the other electrode may be used to generate an electric field which can change a state of the liquid crystal 130a. Although FIG. 4d illustrates that the first electrode unit 110 includes the first substrate 111 and the second electrode 122b of the second electrode unit 120 includes the patterned electrode, the second electrode of the first electrode unit 120 may include the patterned electrode and the second electrode unit 120 may include the second substrate 121.

Figure 5:
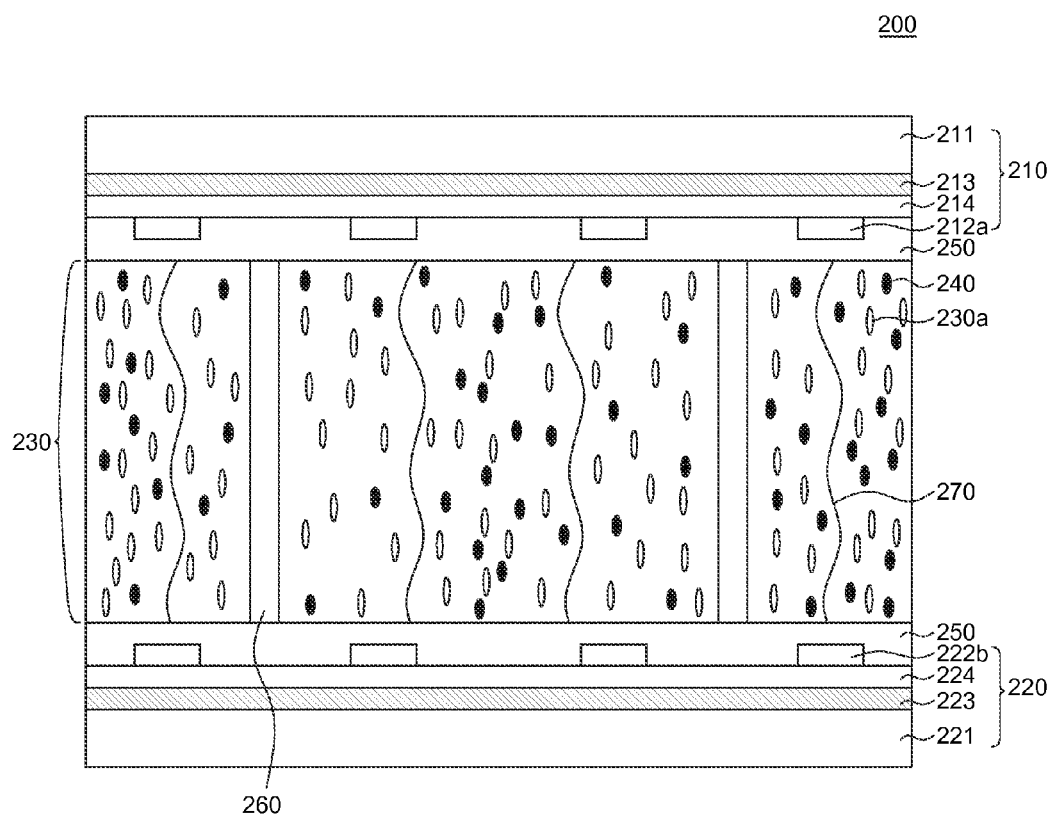
FIG. 5 is a cross-sectional view illustrating another exemplary embodiment of an electrode.

FIG. 5 is a cross-sectional view illustrating another exemplary embodiment of an electrode unit of a light controlling apparatus. In the present exemplary embodiment, descriptions on components identical or corresponding to those of the above-described exemplary embodiment will be omitted.

As illustrated in FIG. 5, alight controlling apparatus 200 according to another exemplary embodiment of the present invention includes a first electrode unit 210, a second electrode unit 220, a liquid crystal unit 230, a coloring member 240, a coloring member 240, an alignment member 250, a wall 260, a network 270, and a spacer.

Further, the liquid crystal unit 230, the coloring member 240, the alignment member 250, the wall 260, the network 270, and the spacer constituting the light controlling apparatus 200 are respectively identical to the liquid crystal unit 130, the coloring member 140, the alignment member 150, the wall 160, the network 170, and the spacer constituting the light controlling apparatus 100 described above with reference to FIG. 1.

However, referring to FIG. 5, the first electrode unit 210 includes a first substrate 211, first electrodes 212a as a plurality of patterned electrodes, a common electrode 213, and an insulating layer 214. In this case, the common electrode 213 is positioned on the first substrate 211, the insulating layer 2134 is positioned on the common electrode 213, and the first electrodes 212a are positioned on the insulating layer 214. As illustrated in FIG. 5, the common electrode 213 may be formed on the entire region of the first substrate 211 or may be patterned as a unit of a specific region. Therefore, the common electrode 213 may be disposed so as to overlap with the first electrodes 212a of a plurality of patterned electrodes. Further, the first electrodes 212a may have a straight shape or a zigzag shape in a plan view. The zigzag shape means that at least one among the first electrodes 212a includes a bending portion, and the zigzag shape may include at least one bending portion.

The insulating layer 214 may be formed of an inorganic insulating material such as a silicon nitride or silicon oxide including SiNx, SiOx, etc., but is not necessarily limited thereto. In addition, the insulating layer 2134 may be formed of an organic insulating material such as photo acryl or benzocyclobutene (BCB).

Further, the second electrode unit 220 includes a second substrate 221, second electrodes 222b as a plurality of patterned electrodes, a common electrode 223, and an insulating layer 224. In this case, the common electrode 223 is positioned on the second substrate 221, the insulating layer 224 is positioned on the common electrode 223, and the second electrodes 222b are positioned on the insulating layer 224. The insulating layer 224 of the second electrode unit 220 may be formed of the same material as the insulating layer 214 of the first electrode unit 210. As illustrated in FIG. 5, the common electrode 223 may be formed on the entire region of the second substrate 221 or may be patterned as a unit of a specific region. Therefore, the common electrode 223 may be disposed so as to overlap with the second electrodes 222b of a plurality of patterned electrodes. Further, the second electrodes 222b may be formed to have a straight shape or a zigzag shape in a plan view. The zigzag shape means that at least one among the second electrodes 222b includes a bending portion, and the zigzag shape may include at least one bending portion.

Also, since the first electrodes 212a are positioned on the common electrode 213 and the second electrodes 222b are positioned on the common electrode 223, not only a horizontal electric field but also a vertical electric field can be applied to the liquid crystal unit 230.

Hereinafter, driving methods of a transparent mode and a light shielding mode of the light controlling apparatus 200 according to the present exemplary embodiment illustrated in FIG. 5 will be described.

A liquid crystal 230a in the liquid crystal unit 230 of the light controlling apparatus 200 is in a homeotropic state as an initial state. Thus, the light controlling apparatus 200 is driven in a transparent mode in which light incident from the outside is transmitted.

Then, if an electric field is applied to the liquid crystal unit 230 by supplying voltages to the first and second electrode units 210 and 220 of the light controlling apparatus 200, the liquid crystal 230a in the liquid crystal unit 230 changed to be from a homeotropic state to a random state including a planar state with a random tilt angle.

To be specific, if the liquid crystal 230a in the liquid crystal unit 230 is a positive type liquid crystal, a long axis of the liquid crystal 230a is moved in a direction to an electric field. Therefore, when a horizontal electric field is formed by supplying voltages to the first electrode unit 210 and the second electrode unit 220, the liquid crystal 230a can be changed to be aligned from the homeotropic state to the random state including the planar state with a random tilt angle. To be specific, the first electrode 212a of the first electrode unit 210 and the common electrode 213 are configured to be applied with voltages having different polarities, and the second electrode 222b of the second electrode unit 220 and the common electrode 223 are configured to be applied with voltages having different polarities. Thus, a horizontal electric field is applied to the first electrode 212a and the common electrode 213. Also, a horizontal electric field is applied to the second electrode 222b and the common electrode 223. For example, if positive (+) voltages are applied to the first electrode 212a and the second electrode 222b, negative (−) voltages may be applied to the common electrodes 213 and 223. Accordingly, the horizontal electric field can be applied to the liquid crystal unit 230 by forming a voltage difference between the first electrode 212a of the first electrode unit 210 and the common electrode 223. Also, the horizontal electric field can be applied to the liquid crystal unit 230 by forming a voltage difference between the second electrode unit 220 of the second electrode 222b and the common electrode 223. Further, the first electrode 212a and the second electrode 222b facing each other can be composed to be applied with the same voltage.

Further, if the liquid crystal 230a in the light shielding unit 230 is a DFLC of which a state is converted using a frequency, voltages having predetermined frequencies (Hz) are applied to the first electrode unit 210 and the second electrode unit 220. For example, when certain driving voltages having driving frequencies of 10 KHz to 1 MHz are supplied, the liquid crystal 230a can be changed to be aligned from the homeotropic state to the random state including the planar state with a random tilt angle. However, the frequency of the voltages is not limited thereto.

Accordingly, the liquid crystal unit 230 may have random state that can scatter light incident from the outside. Further, alignment of the coloring member 240 is changed according to the liquid crystal 230a adjacent to the coloring member 240. Therefore, a part of the light scattered within the liquid crystal unit 230 may go out to the outside of the light controlling apparatus 200 but most of the light is finally scattered and absorbed by the coloring member 240. Therefore, the liquid crystal unit 230 displays a color held in the coloring member 240. Thus, light incident from the outside can be shielded.

Meanwhile, a method for returning the light shielding mode to the transparent mode is the same as described with reference to FIG. 2 and FIG. 3.

Although FIG. 5 illustrates that both of the first electrode unit 210 and the second electrode unit 220 include a plurality of patterned electrodes and a common electrode, only one among the first electrode unit 210 and the second electrode unit 220 may include a plurality of patterned electrodes and a common electrode.

FIG. 6a to FIG. 6d are cross-sectional views of respective steps of a fabricating process of the light controlling apparatus 100 according to an exemplary embodiment of the present invention. A method of fabricating the light controlling apparatus 100 according to an exemplary embodiment of the present invention will be described below with reference to FIG. 6a to FIG. 6d.

Figure 6A:
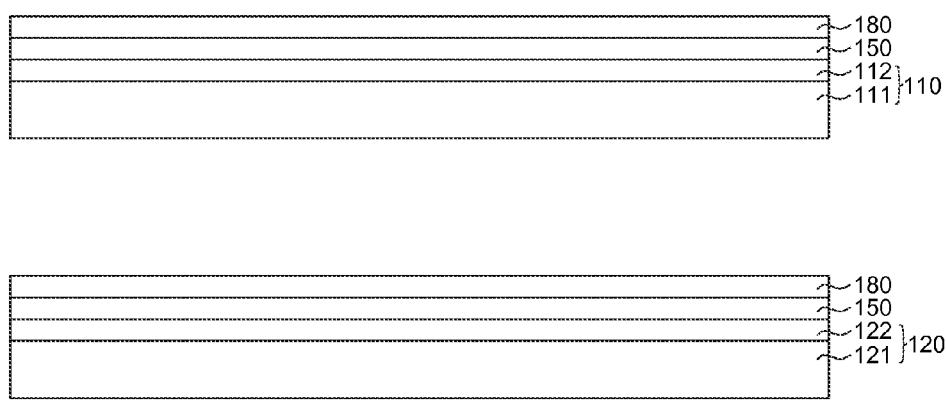
FIG. 6a to FIG. 6d are cross-sectional views of respective steps of a fabricating process of a light controlling apparatus according to an exemplary embodiment of the present invention.

As illustrated in FIG. 6a, the first electrode unit 110 is prepared by forming the first electrode 112 on the first substrate 111 which may be formed of a glass-based or plastic-based material. Further, the second electrode unit 120 is prepared by forming the second electrode 122 on the second substrate 121 which may be formed of a glass-based or plastic-based material. When the first electrode 112 is formed on the first substrate 111 and the second electrode 122 is formed on the second substrate 121, sputtering, patterning, CVD (Chemical Vapor Deposition), and coating methods may be used.

Further, during this process, the alignment member 150 formed of a vertical alignment material is formed on the first electrode 112 and the second electrode 122. That is, the alignment member 150 may be formed by spin-coating or imprinting at least one among polyimide-based or phosphatidylcholine (PPC)-based materials on the first electrode 112 and the second electrode 122.

Furthermore, the alignment unit member 150 may be formed by mixing HTAB (hexadecyltrimethylammonium Bromide) or CTAB (cetyl trimethyl ammonium bromide) in a solvent such as isopropyl alcohol (IPA). Then, the alignment unit member 130 can be formed by coating the mixture on the first electrode unit 121 and the second electrode unit 122 and then evaporating the solvent.

Then, in a state where the alignment member 150 is formed, before a mixed liquid crystal (hereinafter, referred to as "mlc") is disposed between the first electrode unit 110 and the second electrode unit 120, the refractive index matching layer 180 may be formed on the alignment member 150 if necessary. In addition to the step of preparing the first electrode unit 110 and the second electrode unit 120, the step of forming the refractive index matching layer 180 may be performed. For example, after the first electrode 112 is formed on the first substrate 111 or the second electrode 122 is formed on the second substrate 121, the refractive index matching layer 180 may be formed on the first electrode 112 and the second electrode 122. Otherwise, after the refractive index matching layer 180 is formed on the first substrate 111 or the refractive index matching layer 180 is formed on the second substrate 121, the first electrode 112 and the second electrode 122 may be formed on the respective refractive index matching layers 180.

Then, the spacer is positioned on at least one among the first electrode unit 110 and the second electrode unit 120, and the first electrode unit 110 and the second electrode unit 120 are laminated to each other with the spacer interposed therebetween.

Figure 6B:
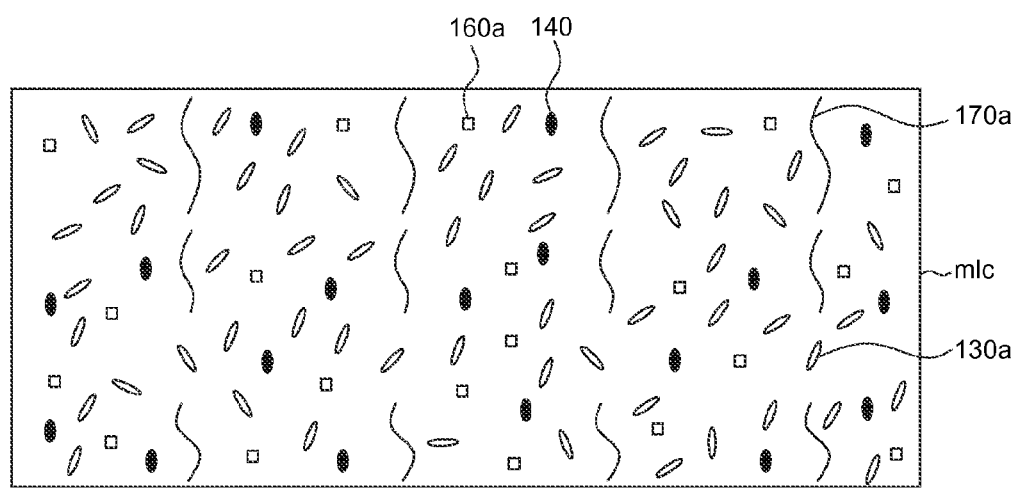

Then, as illustrated in FIG. 6b, the mixed liquid crystal mlc is prepared by mixing the liquid crystal 130a, the coloring member 140 formed of a dye, and a plurality of curing members 160a and 170a. A shape of the plurality of curing members 160a and 170a in FIG. 6b is not limited to illustration in FIG. 6b and may be various. For example, if the first monomer 160a is RM (Reactive Mesogen), the curing member 160a may have a liquid crystal shape.

Herein, the plurality of curing members 160a and 170a are used for forming the wall 160 or the network 170 through a subsequent process.

To be more specific, the mixed liquid crystal mlc includes the plurality of curing members 160a and 170a, and the plurality of curing members 160a and 170a are formed of the first monomer 160a for forming the wall 160 and the second monomer 170a for forming the network 170. The first monomer 160a and the second monomer 170a may be UV curable monomers formed of transparent materials or may be formed of a combination of a UV curable monomer formed of a transparent material and a thermally curable monomer formed of a transparent material. Herein, a photo-curing method such as UV irradiation method may be used, and a thermal curing method such as a hot plate method may be used.

If the first monomer 160a and the second monomer 170a are formed of only UV curable monomers, the first monomer 160a for forming the wall 160 and the second monomer 170a for forming the network 170 may be cured at different wavelength ranges as described above. For example, as described above, if the UV curable monomer as the first monomer 160a for forming the wall 160 is a monomer reactive at a UV wavelength range of 360 to 380 nm, preferably, the UV curable monomer as the second monomer 170a for forming the network 170 may be a monomer reactive at a UV wavelength range of 330 to 360 nm.

Herein, a ratio of the liquid crystal 130a to the curing members 160a and 170a may be 80:20 to 95:5. If the liquid crystal 130a is less than 80 wt % of the mixed liquid crystal mlc, scattering of light caused by the liquid crystal 130a may not occur well. If the liquid crystal 130a is more than 95 wt % of the mixed liquid crystal mlc, the scattering of light caused by the liquid crystal 130a may excessively occur, which may cause a transparent mode not to be realized well. Thus, the ratio of the liquid crystal 130a to the curing members 160a and 170a may be 80:20 to 95:5. Further, a ratio of the first monomer 160a to the second monomer 170a may be 1:1 to 1:2.5 that is not regarded to a ratio of the liquid crystal 130a to the curing members 160a and 170a. Alternatively, if the wall 160 needs to be widely formed, the ratio of the first monomer 160a to the second monomer 170a may be 1:1 to 2.5:1.

Further, since the coloring member 140 is relatively small in amount as compared with the liquid crystal 130a and the curing members 160a and 170a, and the amount of the coloring member 140 does not affect the ratio of the curing members 160a and 170a, the ratio of the curing members 160a and 170a is the same as described above regardless of presence or absence of the coloring member 140.

Then, a mixed liquid crystal unit comprising the mixed liquid crystal mlc is formed between the first electrode unit 110 and the second electrode unit 120. If the first electrode unit 110 and the second electrode unit 120 are laminated and combined with each other, the mixed liquid crystal mlc may be injected between the first electrode unit 110 and the second electrode unit 120 by an injection method using a capillary phenomenon.

Otherwise, if the first electrode unit 110 and the second electrode unit 120 are laminated to each other using a roll-to-roll process, the mixed liquid crystal mlc may be formed between the first electrode unit 110 and the second electrode unit 120 by using a squeeze method in which the mixed liquid crystal mlc is injected at the same time when the first electrode unit 110 and the second electrode unit 120 are laminated to each other.

Figure 6C:
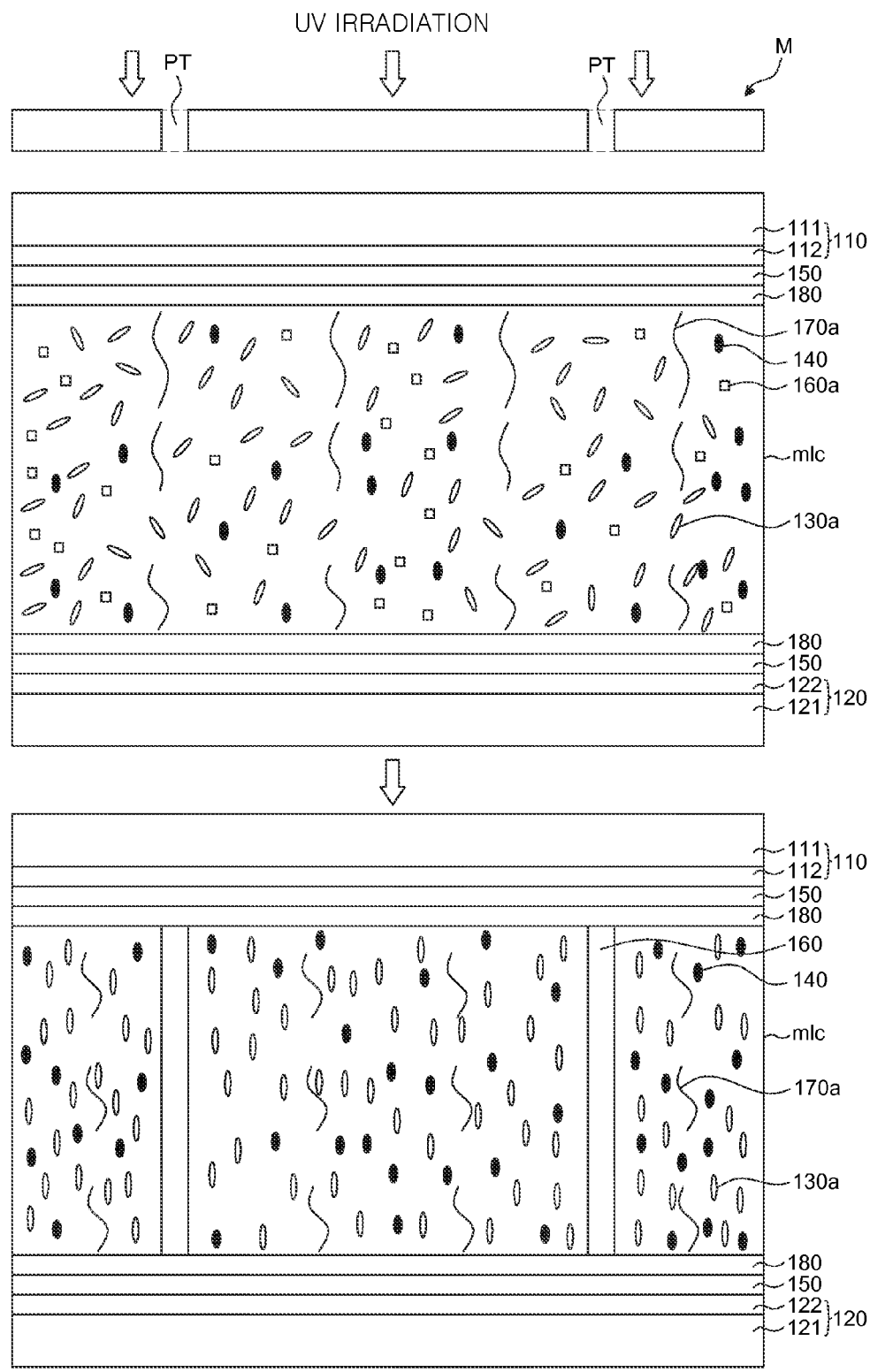

Then, as illustrated in FIG. 6c, primary curing is performed by irradiating light such as UV (ultraviolet) rays to the mixed liquid crystal mlc, and the first monomer 160a is cured through the primary curing, so that the wall 160 can be formed.

For example, in order to cure the first monomer 160a as the UV curable monomer for forming the wall 160, light at a UV wavelength range in which the first monomer 160a is reactive is irradiated. To be more specific, after a mask M having a pattern PT is positioned on at least one among the first electrode unit 110 or the second electrode unit 120, UV rays are irradiated to the mask M. In other words, after the mask M having a hole-shaped pattern PT is positioned on the first electrode unit 110, UV rays are irradiated. For example, the primary curing process may be performed by irradiating UV rays having a wavelength of 360 nm to 380 nm with an intensity of 50 to 300 mW/cm$^2$ for 1 to 60 minutes.

To be more specific, the first monomer 160a for forming the wall 160 present in a region where the UV rays are irradiated, i.e., the region corresponding to the pattern PT of the mask M, has a lower polymerization rate than the second monomer 170a for forming the network 170, and the first monomer 160a for forming the wall 160 has a higher diffusion speed than the second monomer 170a for forming the network 170. Therefore, the first monomer 160a is cured while being phase-separated from the mixed liquid crystal mlc. As the curing process proceeds, the monomer is converted into a polymer in the region where the UV rays are irradiated, i.e., the region corresponding to the pattern PT of the mask M. As the primary curing process proceeds, the first monomers 160a present in a region where the UV rays are not irradiated are moved to the polymer in the mixed liquid crystal mlc. Therefore, the first monomers 160a dispersed throughout the mixed liquid crystal mlc are concentrated in the region where the UV rays are irradiated. Finally, the polymerized wall 160 is formed in the mixed liquid crystal mlc.

Figure 6D:
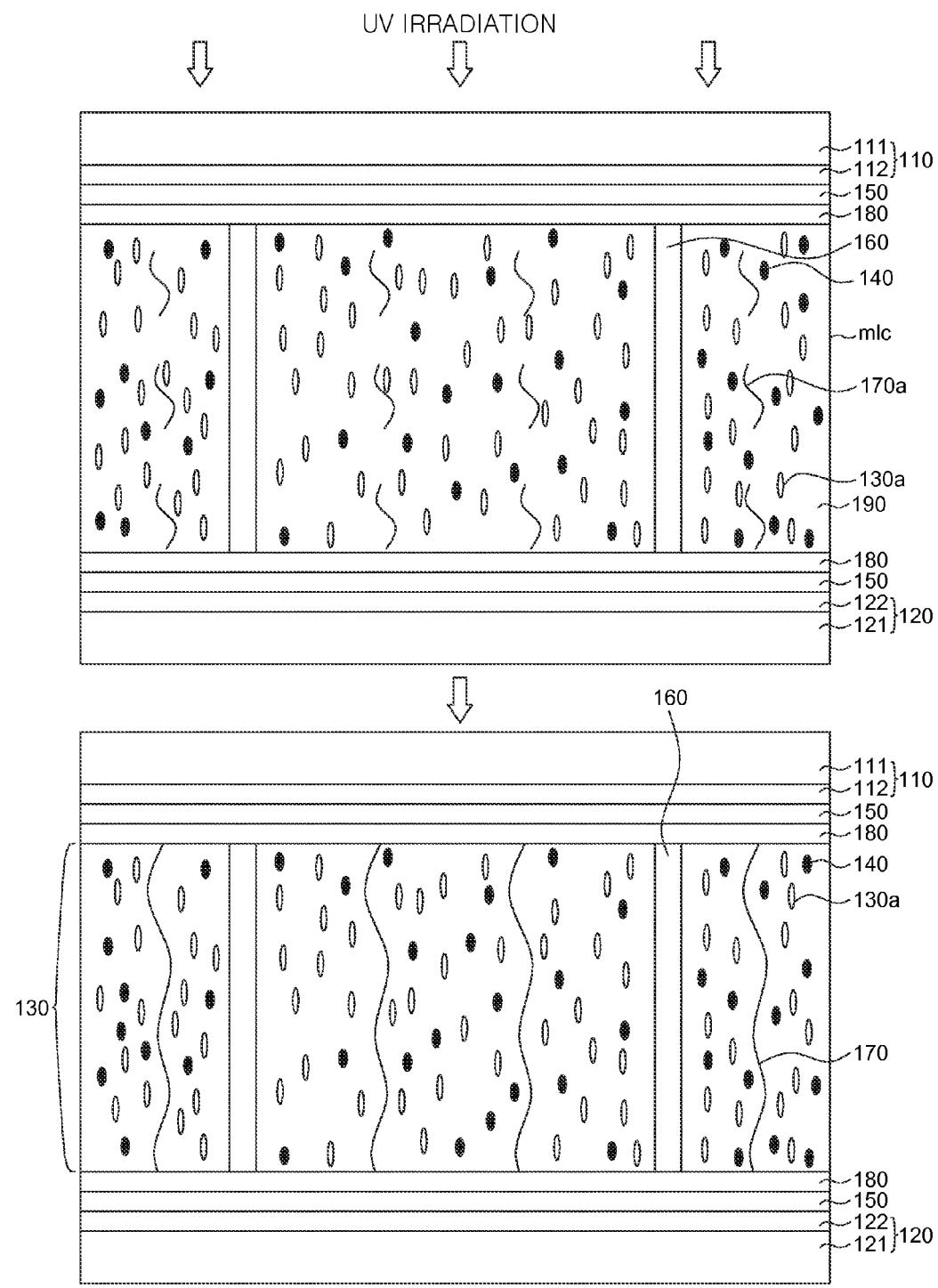

Thus, the wall 160 can divide the inside of the mixed liquid crystal mlc into sections and also confine the coloring member 140 so as not to be moved to another section. Further, since the wall 160 is formed between the first electrode 110 and the second electrode 120, it can serve as a structure capable of supporting the inside of the light controlling apparatus 100. Then, as illustrated in FIG. 6d, secondary curing may be performed by irradiating light such as UV rays to the mixed liquid crystal mlc. To be more specific, the UV rays are irradiated to the entire mixed liquid crystal mlc in which the wall 160 is formed.

Herein, the secondary curing process may be performed by irradiating UV rays having a wavelength of 330 nm to 360 nm with an intensity of 10 to 100 mW/cm$^2$ for 10 to 300 seconds in order to cure the second monomer 170a included in the mixed liquid crystal mlc. Otherwise, the second curing process may be performed with a smaller UV energy than the primary curing process. The UV energy may be adjusted by regulating UV intensity or UV irradiation time. Therefore, UV energy for curing the first monomer 160a may be different from UV energy for curing the second monomer 170a.

The second monomer 170a for forming the network 170 has a higher polymerization rate than the first monomer 160a, and the second monomer 170a has a lower diffusion speed than the first monomer 160a, and, thus, phase separation of the second monomer 170a does not occur. Therefore, the second monomer 170a for forming the network 170 remaining in the mixed liquid crystal mlc after the primary curing process is cured during the secondary curing process. That is, the second monomer 170a for forming the network 170 present in the entire region of the mixed liquid crystal mlc to which the UV rays are irradiated is cured, so that the network 170 is formed in a polymer networked form in the mixed liquid crystal mlc.

Further, a method of fabricating the light controlling apparatus 300 according to another exemplary embodiment of the present invention will be described below with reference to FIG. 7a to FIG. 7d showing cross-sectional views of respective steps of a fabricating process of a light controlling apparatus. In FIG. 7a to FIG. 7d, there will be described a case where among the plurality of curing members 160a and 170a in the mixed liquid crystal mlc, a first monomer 160a for forming the wall 160 is a UV curable monomer and a second monomer 170a for forming the network 170 is a thermally curable monomer.

Figure 7A:
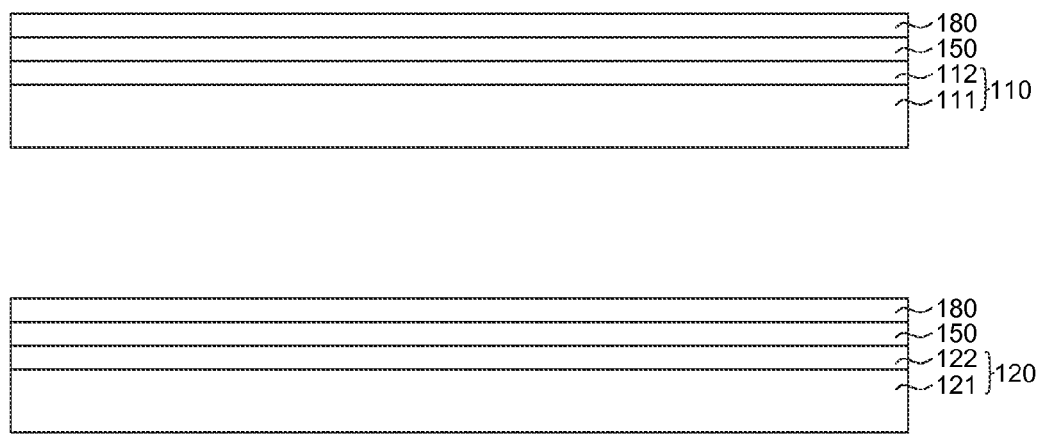
FIG. 7a to FIG. 7d are cross-sectional views of respective steps of a fabricating process of a light controlling apparatus according to an exemplary embodiment of the present invention.
Figure 7B:
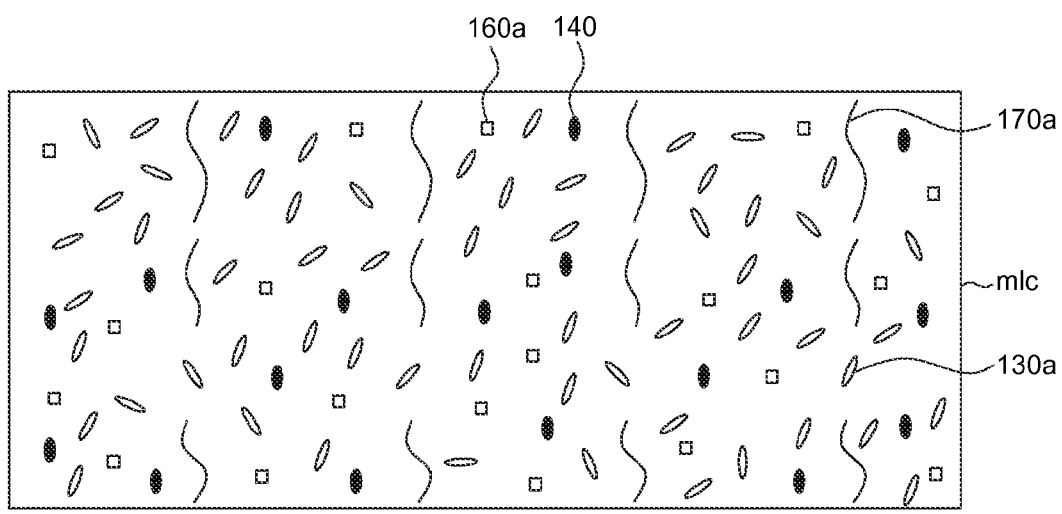
Figure 7C:
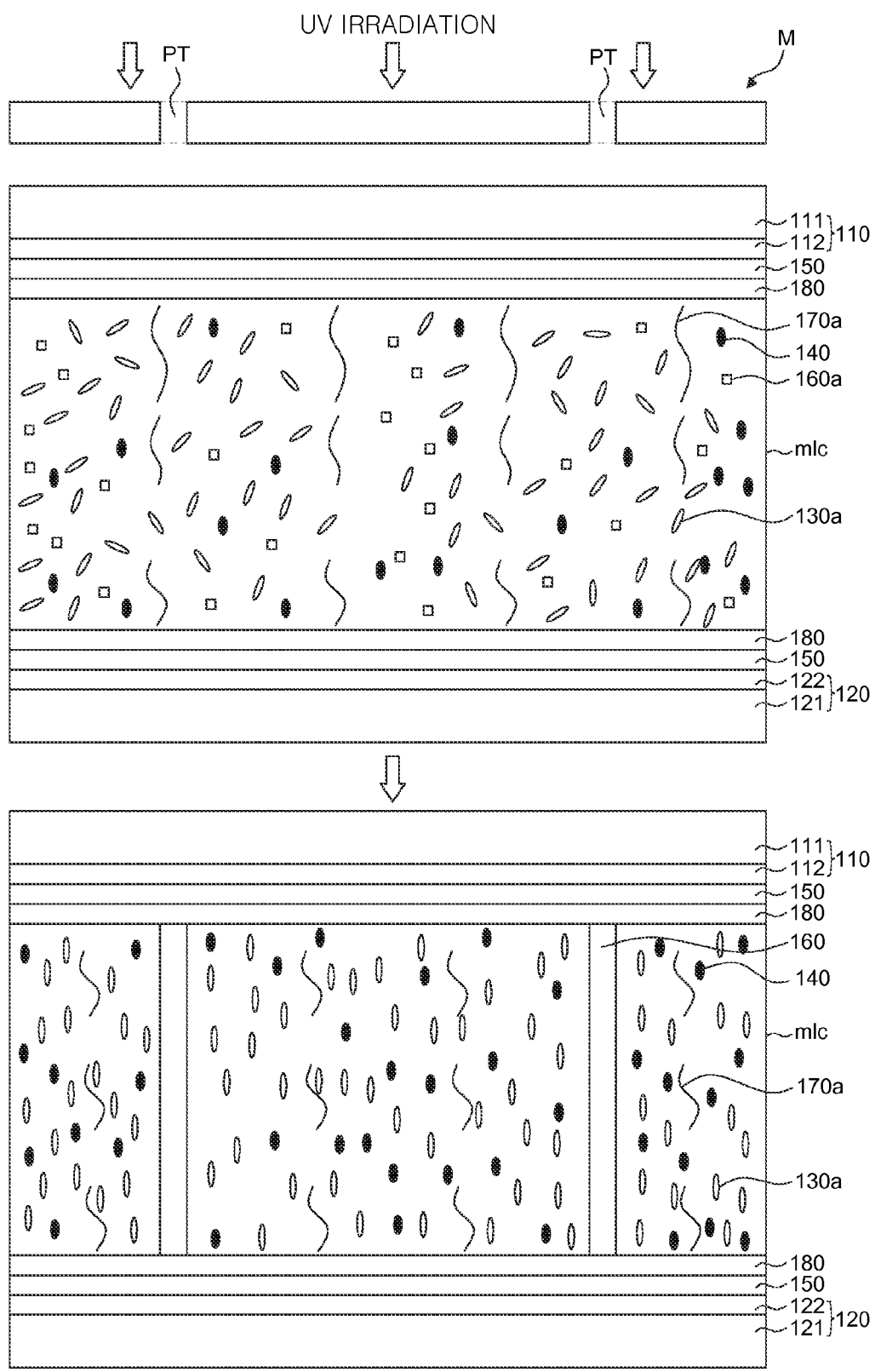

Further, the steps illustrated in FIG. 7a, FIG. 7b, and FIG. 7c are the same as those illustrated in FIG. 6a, FIG. 6b, and FIG. 6c, and, thus, descriptions thereof will be omitted.

Figure 7D:
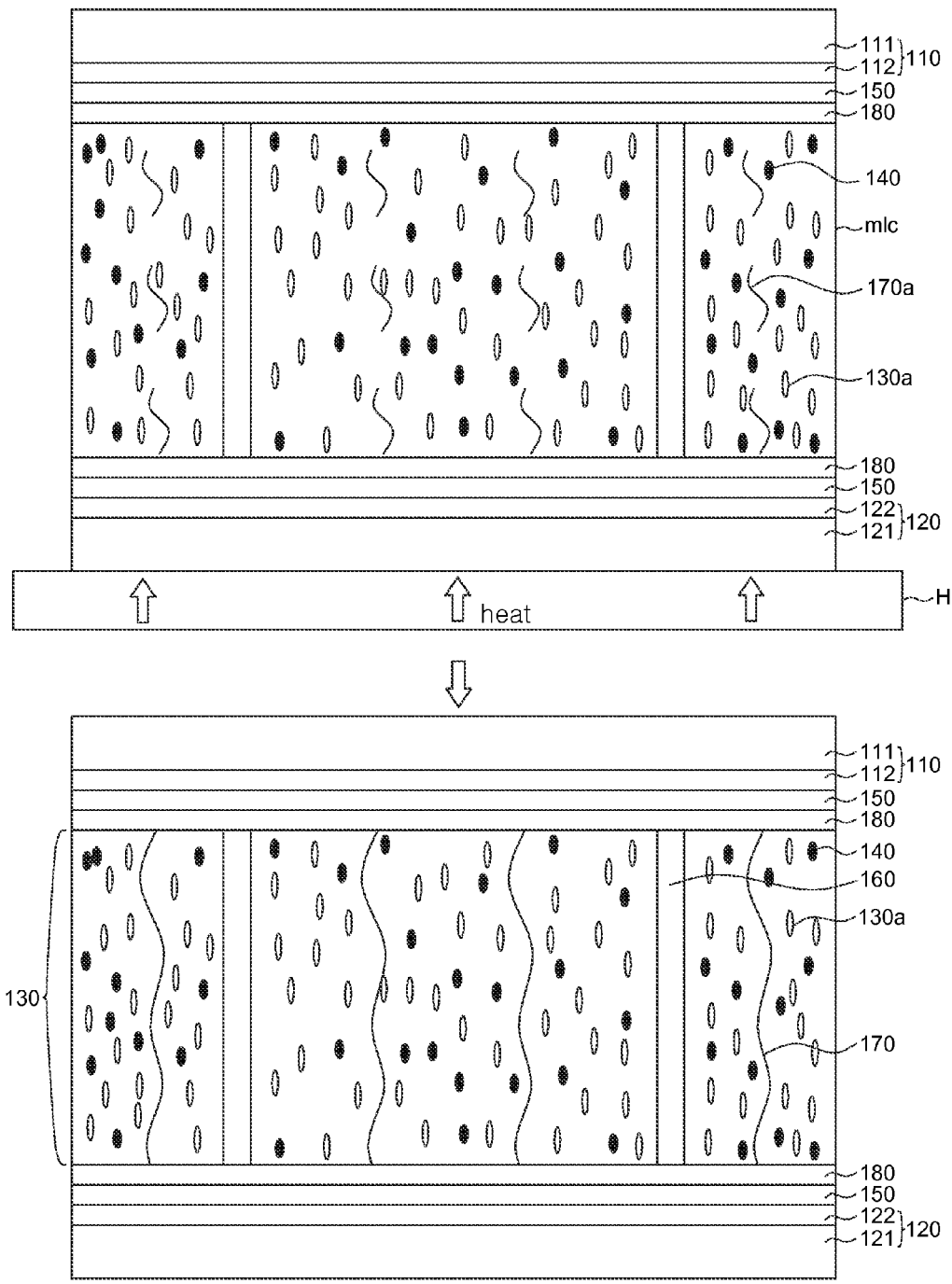

As illustrated in FIG. 7d, after the wall 160 is formed, a secondary curing process is performed to the mixed liquid crystal mlc. This secondary curing process is a thermal curing process by a thermal treatment.

If the second monomer 170a is a thermally curable monomer which can be cured at room temperature to 50° C., the mixed liquid crystal mlc is positioned on a hot plate H having heat in the range of room temperature to 50° C., and then, thermal curing is performed until the network 170 in a polymer networked shape is formed within the mixed liquid crystal mlc. Otherwise, if the second monomer 170a is a thermally curable monomer which can be cured in the range of 50° C. to 80° C., the mixed liquid crystal mlc is positioned on a hot plate H having heat in the range of 50° C. to 80° C., and then, thermal curing is performed until the network 170 in a polymer networked shape is formed within the mixed liquid crystal mlc. By performing such a thermal curing process, the first monomer 160a and the second monomer 170a may be cured independently from each other, and the wall 160 and the network 170 may be formed.

Figure 8:
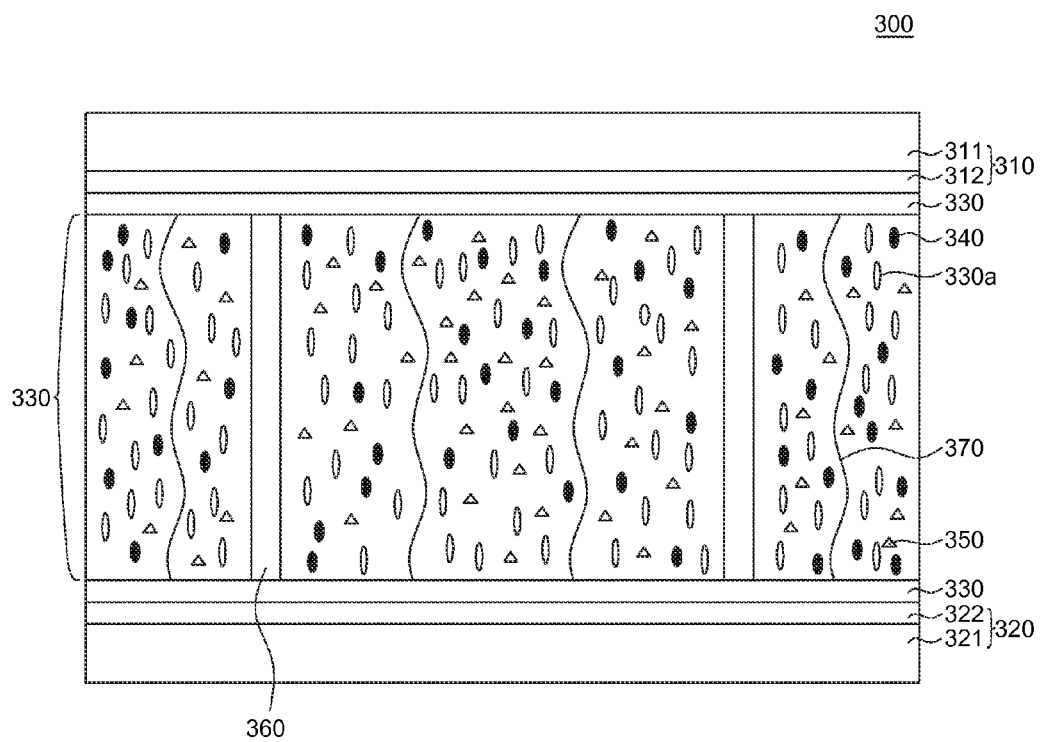
FIG. 8 is a cross-sectional view of a light controlling apparatus according to another exemplary embodiment of the present invention.

FIG. 8 is a cross-sectional view of a light controlling apparatus according to another exemplary embodiment of the present invention. In the present exemplary embodiment, descriptions about components identical or corresponding to those of the above-described exemplary embodiments will be omitted. Hereinafter, referring to FIG. 8, a light controlling apparatus according to the present exemplary embodiment will be described.

As illustrated in FIG. 8, alight controlling apparatus 300 according to another exemplary embodiment of the present invention includes a first electrode unit 310, a second electrode unit 320, a liquid crystal unit 330, a coloring member 340, an alignment member 350, a wall 360, a network 370, and a spacer.

Further, the first electrode unit 310, the second electrode unit 320, the liquid crystal unit 330, the coloring member 340, the wall 360, the network 370, and the spacer constituting the light controlling apparatus 300 are respectively identical to the first electrode unit 110, the second electrode unit 120, the liquid crystal unit 130, the coloring member 140, the wall 160, the network 170, and the spacer constituting the light controlling apparatus 100 described above with reference to FIG. 1.

However, referring to FIG. 8, the alignment member 350 according to the present exemplary embodiment is formed as being mixed with the liquid crystal unit 330. That is, the alignment member 350 is mixed with the liquid crystal unit 330 and is a material for vertically aligning a liquid crystal 330a in the liquid crystal unit 330 in a homeotropic state, i.e., in a state where the liquid crystal 330a is perpendicular to the first electrode 310 or the second electrode 320, after UV curing which is a process of the fabricating process. To be more specific, the alignment member 350 may be formed of at least one among HTAB (hexadecyltrimethylammonium bromide), CTAB (cetyl trimethyl ammonium bromide), POSS (polyhedral oligomeric silsesquioxane), a dendronized polymer, dendrimer, or mixtures thereof, but is not limited thereto. Further, a process for converting a transparent mode to a light shielding mode and a process for converting a light shielding mode to a transparent mode in light the light controlling apparatus 300 according to the present exemplary embodiment are respectively identical to the driving methods of the light controlling apparatus 100 described above with reference to FIG. 2 and FIG. 3.

Figure 9A:
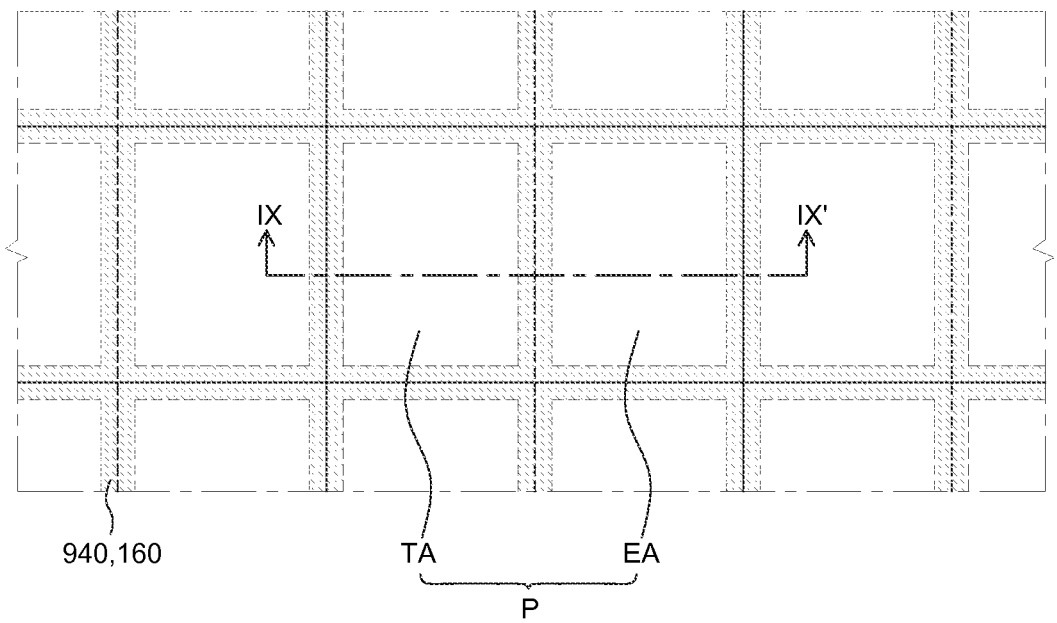
FIG. 9a is a schematic plan view provided for describing a display device to which a light controlling apparatus is applied according to an exemplary embodiment of the present invention.
Figure 9B:
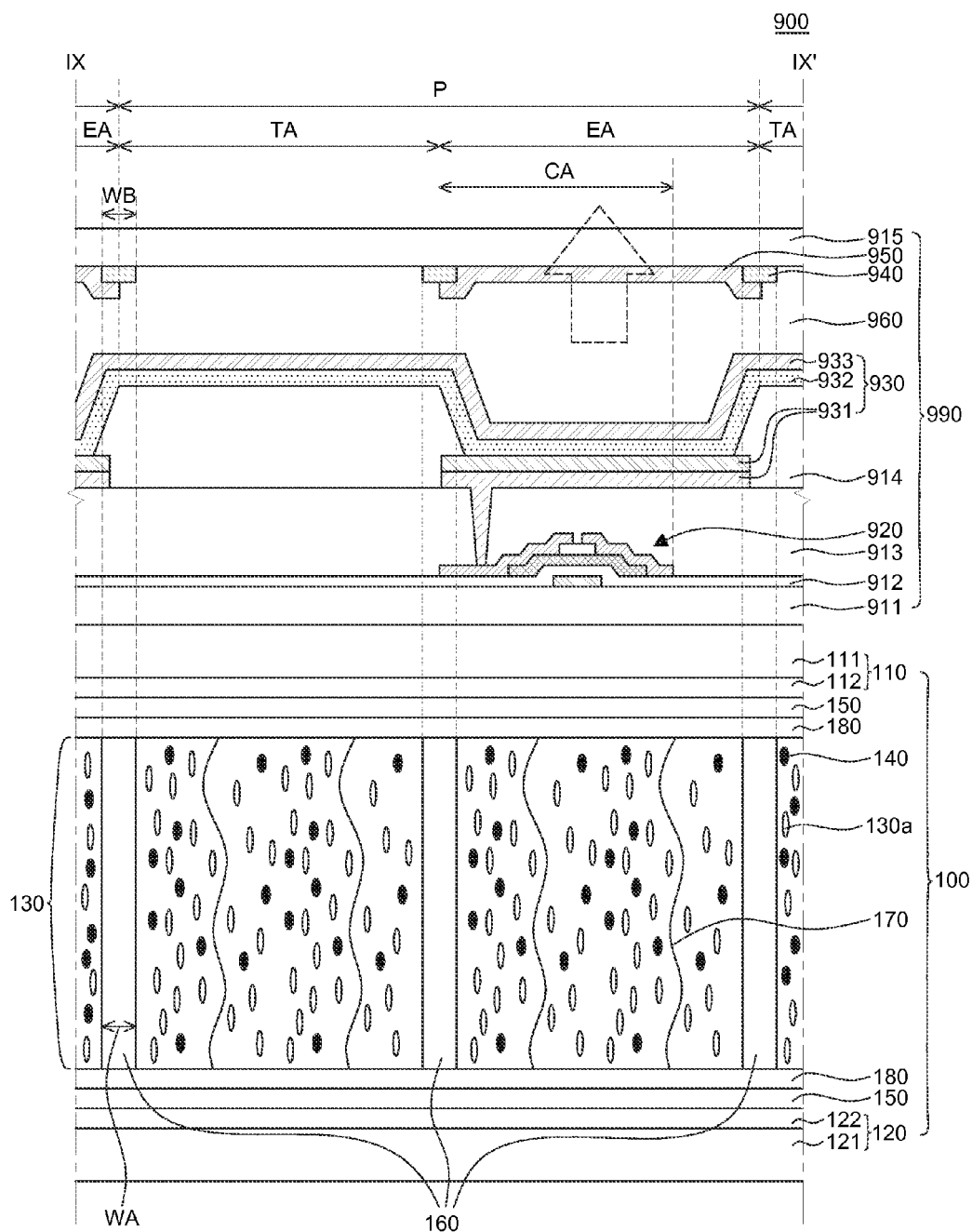

FIG. 9a is a schematic plan view provided for describing a display device to which a light controlling apparatus is applied according to an exemplary embodiment of the present invention. FIG. 9b is a cross-sectional view of the display device taken along a line IX-IX' of FIG. 9a. Referring to FIG. 9a and FIG. 9b, a display device 900 includes a display panel 990 and the light controlling apparatus 100. FIG. 9a illustrates only some of a plurality of pixels P of the display device 900 and illustrates only a black matrix 940 and the wall 160 of the display device 900 for convenience in description.

The display panel 990 is a panel for displaying an image, and may be, for example, an organic light emitting display panel. To be specific, the display panel 990 may be a transparent organic light emitting display panel or transparent flexible organic light emitting display panel including a transmissive area TA as illustrated in FIG. 9. However, the display panel 990 is not limited thereto and may display an image in various ways. Referring to FIG. 9b, the display panel 990 is a top-emission organic light emitting display panel in which a light emitted from an organic light emitting element 930 emits toward an upper substrate 915. Further, the display panel 990 is a transparent organic light emitting display panel including a transmissive area TA.

Referring to FIG. 9a and FIG. 9b, the display panel 990 includes a plurality of pixels P, and each pixel P includes a transmissive area TA, an emissive area EA, and a circuit area CA. The transmissive area TA refers to an area where an external light incident from the outside of the display panel 990 is transmitted. A user can see a background, i.e., a background of the display device 900, through the transmissive area TA. The emissive area EA refers to an area where light emitted from the organic light emitting element 930 emits and also refers to an area where an image is displayed by the organic light emitting element 930. The circuit area CA refers to an area where various circuits for driving the organic light emitting element 930 are disposed, and may overlap with the emissive area EA.

Referring to FIG. 9b, a thin-film transistor 920 is disposed on a lower substrate 911 of the display panel 990. To be specific, the thin-film transistor 920 is disposed in the circuit area CA, and includes a gate electrode, an active layer, a source electrode, and a drain electrode. Further, agate insulating layer 912 configured to insulate the gate electrode from the active layer is disposed. A planarization layer 913 configured to planarize an upper part of the thin-film transistor 920 is disposed on the thin-film transistor 920, and the organic light emitting element 930 is disposed on the planarization layer 913. The organic light emitting element 930 is disposed in the emissive area EA, and includes an anode 931 for supplying a hole to an organic light emitting layer 932, the organic light emitting layer 932, and a cathode 933 for supplying an electron to the organic light emitting layer 932. The anode 931 is electrically connected with the thin-film transistor 920 through a contact hole in the planarization layer 913. As described above, since the display panel 990 is a top-emission organic light emitting display panel, the anode 931 includes, for example, at least a transparent conductive layer formed of transparent conductive oxide (TCO) and a reflective layer disposed under the transparent conductive layer and configured to reflect light emitted from the organic light emitting element 930 to an upper part of the display panel 990. However, the anode 931 may be defined as including the transparent conductive layer only, and the reflective layer may be defined as a component separate from the anode 931. A bank 914 that defines the emissive area EA is disposed on the anode 931, and the organic light emitting layer 932 and the cathode 933 are disposed on the anode 931 and the bank 914. The organic light emitting layer 932 can emit light of a specific color, for example, light of any one color of white, red, green, and blue. In the following description, it is described that the organic light emitting layer 932 emits a white light. The cathode 933 is disposed on the organic light emitting layer 932. As described above, since the display panel 990 is a top-emission organic light emitting display panel 990, the cathode 933 may be formed of a transparent conductive material or a metallic material. If the cathode 933 is formed of a metallic material, the cathode 933 is formed to have a very small thickness, allowing light emitted from the organic light emitting layer 932 to pass through the cathode 933.

The black matrix 940 is disposed on the upper substrate 915 of the display panel 990. The black matrix 940 is disposed at a boundary between the pixels P and a boundary between the transmissive area TA and the emissive area EA. Further, a color filter 950 is disposed in the emissive area EA on the upper substrate 915 of the display panel 990. The color filter 950 may be one among a red color filter, a green color filter, and a blue color filter, but is not limited thereto, and may be a color filter that transmits light of another color. The upper substrate 915 and the lower substrate 911 are bonded to each other by an adhesive layer 960. Although not illustrated in FIG. 9b, the display panel 990 may further include a sealing layer for protecting the organic light emitting element 930 against moisture or oxygen from the outside.

The light controlling apparatus 100 may be combined with the display panel 990. Therefore, the light controlling apparatus 100 can provide a light shielding mode and a transparent mode to the user. To be more specific, the light controlling apparatus 100 may be bonded to a rear surface of the display panel 990 that is opposite from a front surface of the display panel 990 which is a light emitting surface of the display panel 990. Herein, although not illustrated in FIG. 9b, if an adhesive member, for example, an optical clear adhesive (OCA) as one among optical transparent adhesives is used to bond or assemble the light controlling apparatus 100 to the rear surface of the transparent display panel 990 and a lamination process is performed thereto. The light controlling apparatus 100 can be finally combined with the display panel 990. Further, the OCA may have a refractive index ranging from 1.4 to 1.9.

The wall 160 of the light controlling apparatus 100 is disposed so as to correspond to the black matrix 940 of the display panel 990. That is, as illustrated in FIG. 9a and FIG. 9b, the wall 160 of the light controlling apparatus 100 is disposed to overlap with the black matrix 940 of the display panel 990 and disposed at all of the boundary between the pixels P of the display panel 990 and the boundary between the transmissive area TA and the emissive area EA. Herein, a width WA of the wall 160 may be equal to or smaller than a width WB of the black matrix 940. If the wall 160 of the light controlling apparatus 100 is disposed as described above, the wall 160 may be disposed in a mesh structure in a plan view as illustrated in FIG. 9a.

Otherwise, although not illustrated, the wall 160 may be disposed in a stripe structure so as to overlap with a part of the black matrix 940.

The wall 160 of the light controlling apparatus 100 as described above may be manufactured by the same method as described with reference to FIG. 6c. That is, the wall 160 may be formed by irradiating UV rays with the mask M having the pattern PT corresponding to the black matrix 940 of the display panel 990 in order to form the wall 160 at a position corresponding to the black matrix 940 of the display panel 990.

Hereinafter, driving methods of a transparent mode and a light shielding mode of the light controlling apparatus 100 will be described with reference to the display device 900 that supplies an image.

While the display panel 990 does not supply an image, the light controlling apparatus 100 is driven in a transparent mode. As described above, since the liquid crystal 130a in the liquid crystal unit 130 of the light controlling apparatus 100 is in a homeotropic state as an initial state, while a voltage is not applied to the light controlling apparatus 100, the light controlling apparatus 100 is driven in a transparent mode in which light incident from the outside is transmitted.

Further, while the display panel 990 supplies an image, the light controlling apparatus 100 is driven so as to shield light incident from the rear surface that is opposite surface of the front surface which is a light emitting surface of the display panel 990. To be specific, while the display panel 990 supplies an image, a voltage is applied to the first electrode unit 110 and the second electrode unit 120 of the light controlling apparatus 100 such that there is a voltage difference between the first electrode unit 110 and the second electrode unit 120, and, thus, the liquid crystal 130a in the liquid crystal unit 130 is disposed in disorder. Therefore, the liquid crystal unit 130 scatters light incident from the outside, and the light controlling apparatus 100 blocks the light incident from the outside from being seen through the rear surface of the display panel 990. Thus, the quality of an image can be improved.

Furthermore, the light controlling apparatus 100 may provide background image having a color to the user by showing the color of the coloring member 140. Therefore, the display panel 990 may provide an aesthetic effect to the user, if necessary, in addition to the shielding function.

Although FIG. 9b illustrates that the wall 160 of the light controlling apparatus 100 is disposed at all of the boundary between the pixels P of the display panel 990 and the boundary between the transmissive area TA and the emissive area EA, the wall 160 may be disposed so as to overlap with only the black matrix 940 disposed at the boundary between the pixels P of the display panel 990.

Further, since the emissive area EA of the display panel 990 is an area for emitting light but not an area capable of transmitting an external light, a portion of the light controlling apparatus 100 corresponding to the emissive area EA may not be realized in a light shielding mode and a transparent mode. That is, the portion of the light controlling apparatus 100 corresponding to the emissive area EA may be continuously in a transparent mode. In this regard, although FIG. 9b illustrates that the first electrode 112 of the first electrode unit 110 and the second electrode 122 of the second electrode unit 120 are disposed so as to correspond to all of the emissive area EA and the transmissive area TA, the first electrode 112 and the second electrode 122 may be disposed only in the transmissive area TA.

Although FIG. 9b illustrates that the light controlling apparatus 100 illustrated in FIG. 1 to FIG. 3 is used as the light controlling apparatus 100, the light controlling apparatus 100 is not limited thereto. The light controlling apparatuses 100 and 200 illustrated in FIG. 4a to FIG. 4d and FIG. 5 may be used as being combined with the display panel 990. Further, although FIG. 9b illustrates that the first electrode unit 110 of the light controlling apparatus 100 is in contact with the lower substrate 911 of the display panel 990, the second electrode unit 120 of the light controlling apparatus 100 may be in contact with the lower substrate 911 of the display panel 990.

Furthermore, the lower substrate 911 of the display panel 990 may be one of substrates constituting the first electrode unit 110 or the second electrode unit 120 of the light controlling apparatus 100. For example, if the first electrode 112 of the first electrode unit 110 or the second electrode 122 of the second electrode unit 120 constituting the light controlling apparatus 100 is formed on a rear surface of the lower substrate 911 of the display panel 990, the lower substrate 911 of the display panel 990 plays the same role as the substrates 111 and 121 constituting the first electrode unit 110 or the second electrode unit 120. Therefore, the lower substrate 911, the first electrode 112 of the first electrode unit 110, or the second electrode 122 of the second electrode unit 120 may have the same configuration as the first electrode unit 110 or second electrode unit 120 as described above.

Figure 9C:
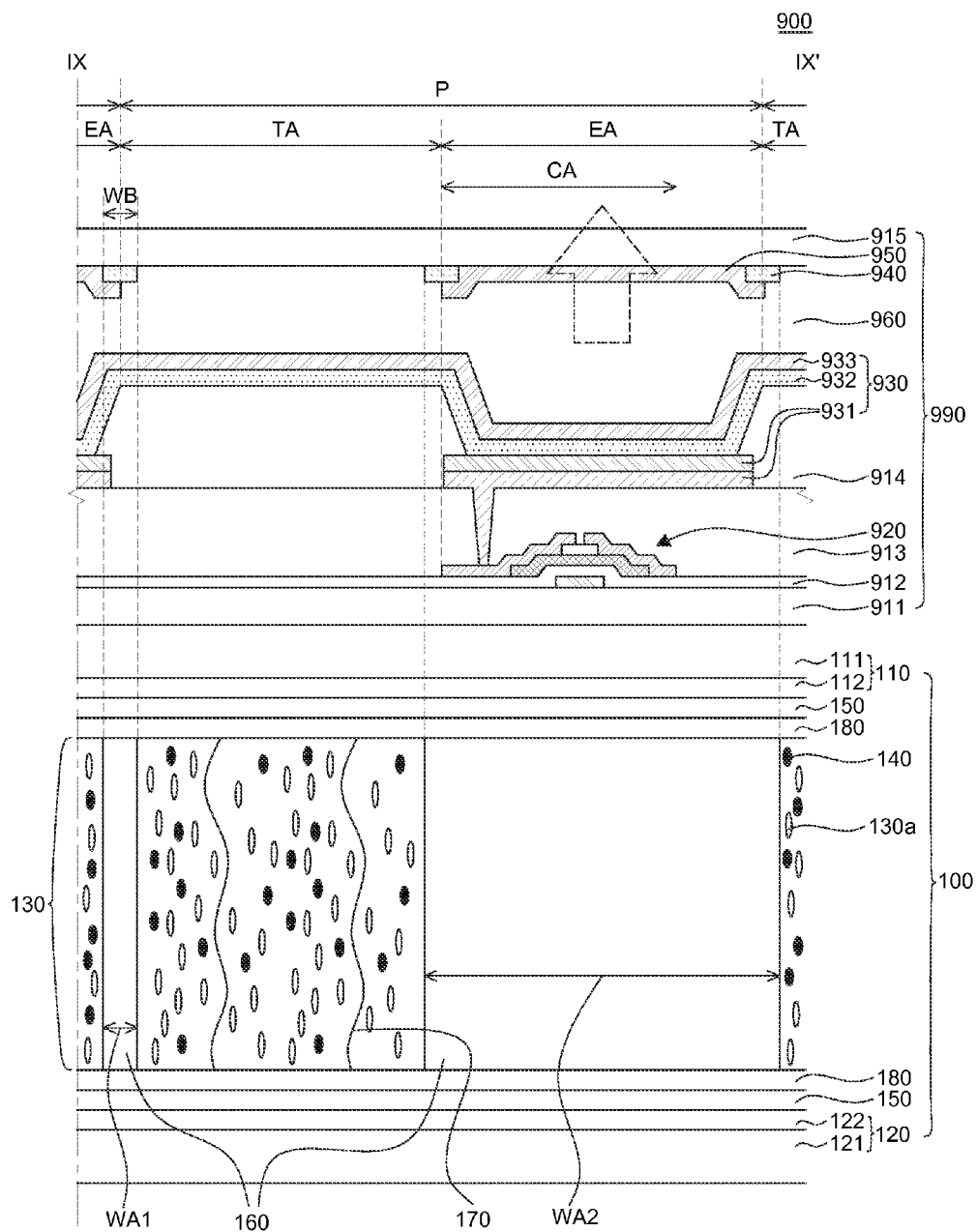
FIG. 9c and FIG. 9d are cross-sectional views of display devices according to various exemplary embodiments of the present invention.

FIG. 9c is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 9c.

Referring to FIG. 9c, the wall 160 of the light controlling apparatus 100 may be disposed so as to overlap with the black matrix 940 of the display panel 990 and may also be disposed in the emissive area EA of the display panel 990. Herein, a width WA1 of the wall 160 overlapping with the black matrix 940 only is equal to the width WB of the black matrix 940 and smaller than a width WA2 of the wall 160 overlapping with the black matrix 940 and the emissive area EA. Since the emissive area EA of the display penal 990 is an area for emitting light but not an area capable of transmitting an external light, the liquid crystal 130a and the coloring member 140 for shielding or transmitting an external light may not be disposed in a portion of the light controlling apparatus 100 corresponding to the emissive area EA. Therefore, as illustrated in FIG. 9c, the wall 160 of the light controlling apparatus 100 may be formed so as to correspond to the entire emissive area EA.

The wall 160 of the light controlling apparatus 100 may be manufactured by the same method as described with reference to FIG. 6c. That is, the wall 160 may be formed by irradiating UV rays with the mask M having the pattern PT at a position corresponding to the black matrix 940 of the display panel 990 and at a position corresponding to the emissive area EA.

A driving method of the light controlling apparatus 100 combined with the display panel 990 is the same as described above with reference to FIG. 9*b*, and, thus, redundant descriptions thereof will be omitted.

Although FIG. 9*c* illustrates that the wall 160 is formed so as to correspond to the entire emissive area EA, the wall 160 may be formed so as to correspond to only a partial area of the emissive area EA.

Figure 9D:
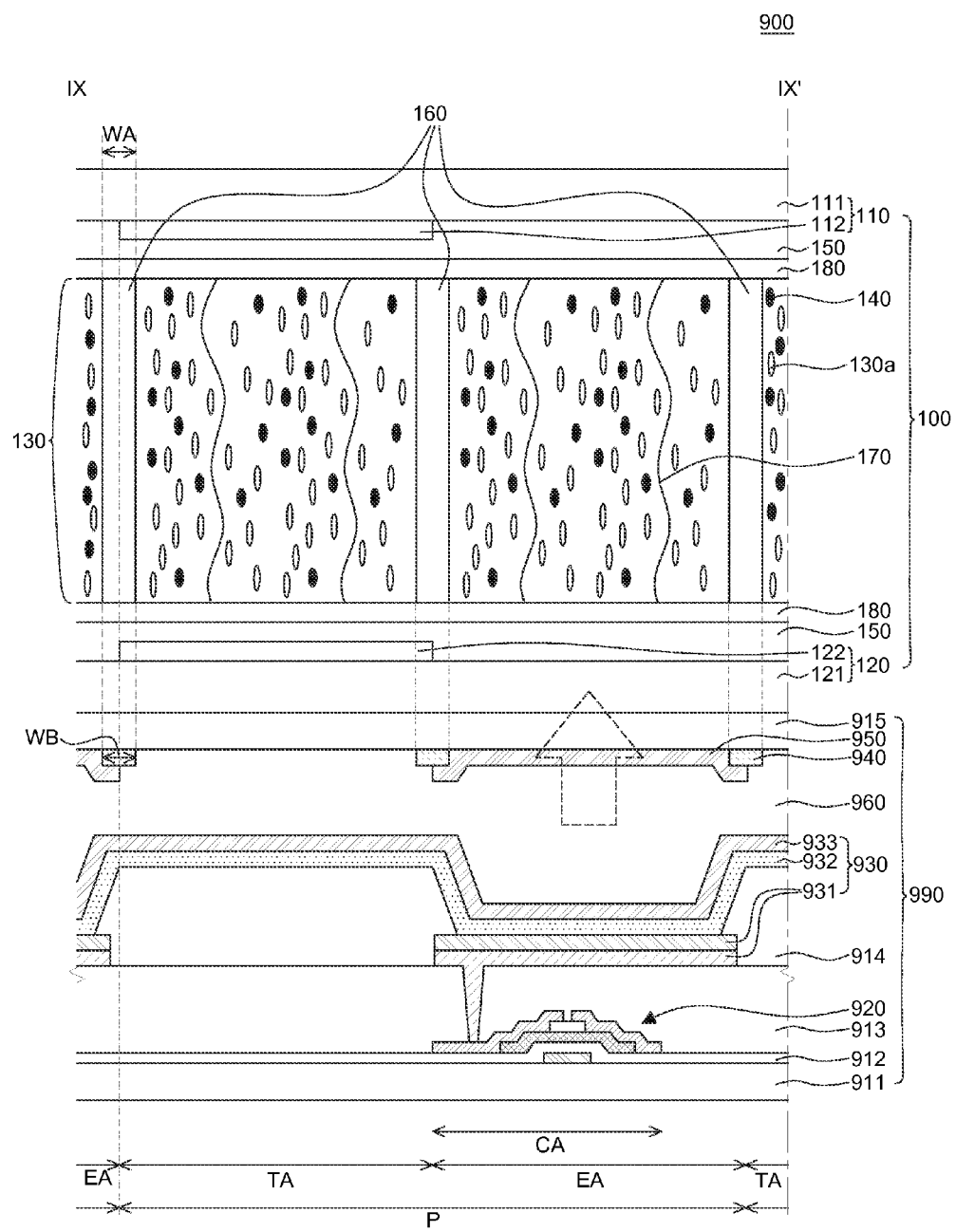

FIG. 9*d* is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 9*d*.

Referring to FIG. 9*d*, the light controlling apparatus 100 may be bonded to the front surface as a light emitting surface of the display panel 990. In this case, although not illustrated in FIG. 9*d*, if an adhesive member, for example, OCA as one among optical transparent adhesives, is used to bond or assemble the light controlling apparatus 100 to the rear surface of the transparent display panel 990 and a lamination process is performed thereto. The light controlling apparatus 100 can finally be combined with the display panel 990.

The wall 160 of the light controlling apparatus 100 is disposed so as to correspond to the black matrix 940 of the display panel 990. That is, as illustrated in FIG. 9*d*, the wall 160 of the light controlling apparatus 100 is disposed to overlap with the black matrix 940 of the display panel 990 so as to be disposed at all of the boundary between the pixels P of the display panel 990 and the boundary between the transmissive area TA and the emissive area EA. Herein, the width WA of the wall 160 may be equal to or smaller than the width WB of the black matrix 940. If the wall 160 of the light controlling apparatus 100 is disposed as described above, the wall 160 may be disposed in a mesh structure in a plan view. Otherwise, although not illustrated, the wall 160 may be disposed in a stripe structure so as to overlap with a part of the black matrix 940.

The wall 160 of the light controlling apparatus 100 as described above may be manufactured by the same method as described with reference to FIG. 6*c*. That is, the wall 160 may be formed by irradiating UV rays with the mask M having the pattern PT corresponding to the black matrix 940 of the display panel 990 in order to form the wall 160 at a position corresponding to the black matrix 940 of the display panel 990.

Since the light controlling apparatus 100 is disposed on the front surface of the display panel 990, the first electrode 112 of the first electrode unit 110 and the second electrode 122 of the second electrode unit 120 are formed so as to correspond to the transmissive area TA only. During a manufacturing process of the light controlling apparatus 100, the liquid crystal 130*a* and the coloring member 140 are disposed on the entire region of the light controlling apparatus 100. That is, as illustrated in FIG. 6*b* to FIG. 6*d*, the light controlling apparatus 100 is manufactured by curing the wall 160 and the network 170 in a state where the mixed liquid crystal mlc is disposed on the entire region of the light controlling apparatus 100. Thus, it may be difficult not to dispose the liquid crystal 130*a* and the coloring member 140 in a portion of the light controlling apparatus 100 corresponding to the emissive area EA to leave the corresponding space empty during a process.

Therefore, if the first electrode 112 and the second electrode 122 are disposed in the emissive area EA, the light controlling apparatus 100 may also be driven in the emissive area EA. Accordingly, light emitted from the emissive area EA may be blocked by the light controlling apparatus 100. Thus, as illustrated in FIG. 9*d*, the first electrode 112 and the second electrode 122 are disposed so as to correspond to the transmissive area TA only, so that only a portion of the light controlling apparatus 100 corresponding to the transmissive area TA is driven and a portion of the light controlling apparatus 100 corresponding to the emissive area EA is continuously maintained in a transparent mode.

Hereinafter, driving methods of a transparent mode and a light shielding mode of the light controlling apparatus 100 will be described with reference to the display device 900 that supplies an image.

While the display panel 990 does not supply an image, the light controlling apparatus 100 is driven in a transparent mode. That is, while a voltage is not applied to the light controlling apparatus 100, the light controlling apparatus 100 is realized in a transparent mode in which light incident from the outside is transmitted.

While the display panel 990 supplies an image, the light controlling apparatus 100 is realized so as to block light incident from the rear surface. To be specific, while the display panel 990 supplies an image, a voltage is applied to the first electrode unit 110 and the second electrode unit 120 of the light controlling apparatus 100, and, thus, the liquid crystal 130*a* in the liquid crystal unit 130 is disposed in disorder. Therefore, the liquid crystal unit 130 scatters light incident from the outside, and the light controlling apparatus 100 blocks the light incident from the outside from being seen through the transmissive area TA. Thus, the quality of an image can be improved. In this case, since the first electrode 112 and the second electrode 122 are not formed in the portion of the light controlling apparatus 100 corresponding to the emissive area EA, the light controlling apparatus 100 is still realized in a transparent mode, and, thus, the user can see an image through the emissive area EA.

Although FIG. 9*d* illustrates that the wall 160 of the light controlling apparatus 100 is disposed at all of the boundary between the pixels P of the display panel 990 and the boundary between the transmissive area TA and the emissive area EA, the wall 160 may be disposed so as to overlap with only the black matrix 940 disposed at the boundary between the pixels P of the display panel 990.

Further, the upper substrate 915 of the display panel 990 may be one of substrates constituting the first electrode unit 110 or the second electrode unit 120 of the light controlling apparatus 100. For example, if the first electrode 112 of the first electrode unit 110 or the second electrode 122 of the second electrode unit 120 constituting the light controlling apparatus 100 is formed on a front surface of the upper substrate 915 of the display panel 990, the upper substrate 915 of the display panel 990 plays the same role as the substrates 111 and 121 constituting the first electrode unit 110 or the second electrode unit 120. Therefore, the upper substrate 915, the first electrode 112 of the first electrode unit 110, or the second electrode 122 of the second electrode unit 120 may have the same configuration as the first electrode unit 110 or second electrode unit 120 as described above.

Furthermore, when the light controlling apparatus 100 is bonded to the front surface as a light emitting surface of the display panel 990, the wall 160 may also be formed in the emissive area EA. That is, as illustrated in FIG. 9c, a part of the partition wall 160 may overlap with the black matrix 940 only and another part thereof may overlap with the black matrix 940 and the emissive area EA. As described above, since the wall 160 is formed of a UV curing monomer formed of a transparent material capable of transmitting light, the wall 160 may be formed so as to correspond to the entire emissive area EA in order for the portion of the light controlling apparatus 100 corresponding to the emissive area EA to continuously transmit light.

Although FIG. 9a to FIG. 9d illustrate that the display panel 900 is an organic light emitting display panel of a top-emission type or a bottom-emission type, the display panel 900 may be a dual-emission organic light emitting display panel. That is, the display panel 900 may display an image through a front surface and a rear surface of the display panel. In this case, the light controlling apparatus 100 may be disposed only on one among the front surface and the rear surface of the display panel 900 or may be disposed on both of the front surface and the rear surface of the display panel 900. That is, at least one light controlling apparatus 100 may be attached to the display panel 900.

Figure 10A:
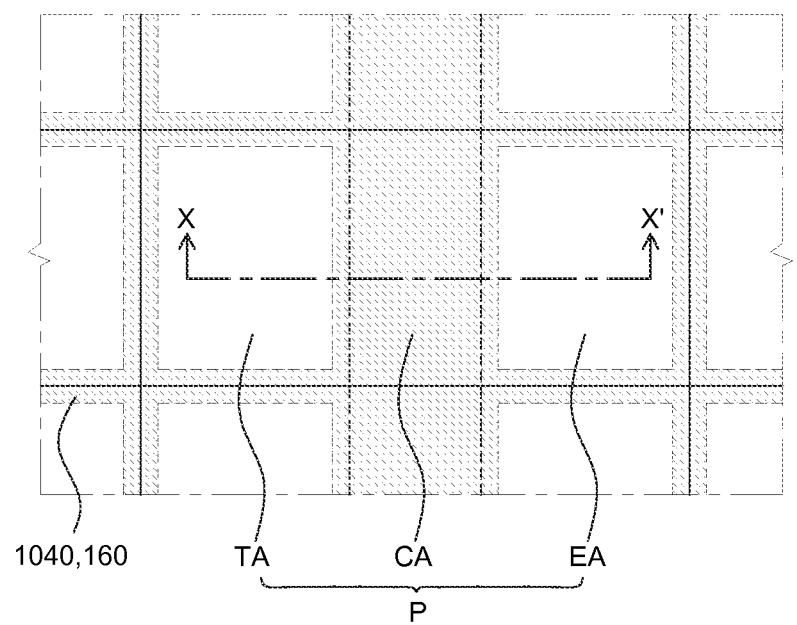
FIG. 10a is a schematic plan view provided for describing a display device to which a light controlling apparatus is applied according to an exemplary embodiment of the present invention.
Figure 10B:
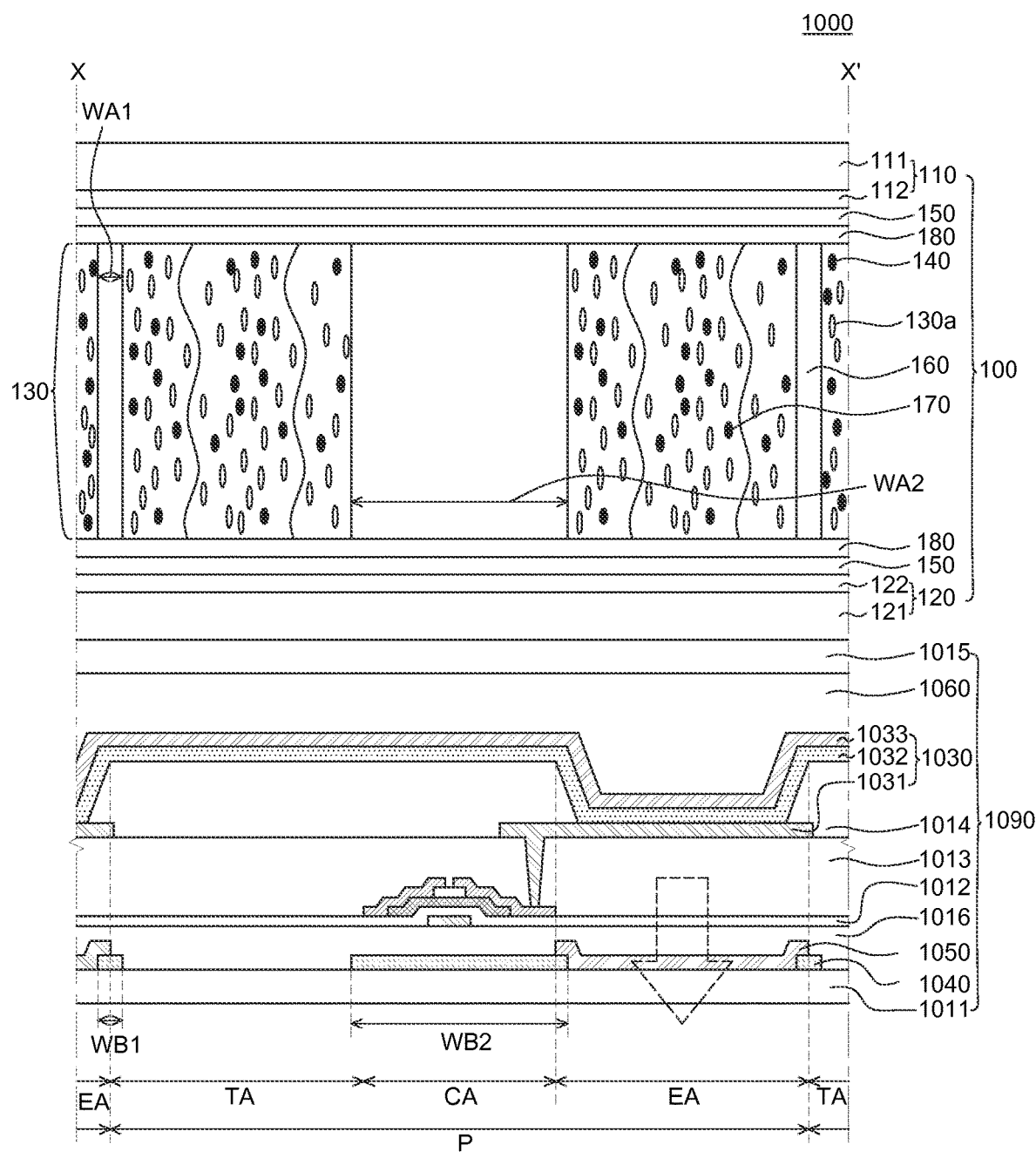

FIG. 10a is a schematic plan view provided for describing a display device to which a light controlling apparatus is applied according to an exemplary embodiment of the present invention. FIG. 10b is a cross-sectional view of the display device taken along a line X-X' of FIG. 10a. Referring to FIG. 10a and FIG. 10b, a display device 1000 includes a display panel 1090 and the light controlling apparatus 100. FIG. 10a illustrates only some of a plurality of pixels P of the display device 1000 and illustrates only a black matrix 1040 and the wall 160 of the display device 1000 for convenience in description. In the present exemplary embodiment, descriptions on components identical or corresponding to those of the above-described exemplary embodiment will be omitted. Hereinafter, the display device 1000 according to the present exemplary embodiment will be described with reference to FIG. 10a.

Referring to FIG. 10b, the display panel 1090 may be a bottom-emission organic light emitting display panel in which light emitted from an organic light emitting element 1030 is released toward a lower substrate 1011. Further, the display panel 1090 is a transparent organic light emitting display panel including a transmissive area TA.

Referring to FIG. 10a and FIG. 10b, the display panel 1090 includes a plurality of pixels P, and each pixel P includes a transmissive area TA, an emissive area EA, and a circuit area CA. As compared with the display device 900 described above with reference to FIG. 9a and FIG. 9b, the display panel 1090 illustrated in FIG. 10a and FIG. 10b is a bottom-emission organic light emitting display panel, and, thus, the emissive area EA does not overlap with the circuit area CA. That is, since light emitted from the emissive area EA needs to pass through the lower substrate 1011 so as to be released to the outside, the circuit area CA in which various circuits are disposed does not overlap with the emissive area EA.

Referring to FIG. 10b, a thin-film transistor 1020 is disposed on the lower substrate 1011 of the display panel 1090. To be specific, the thin-film transistor 1020 is disposed in the circuit area CA. Further, a gate insulating layer 1012 configured to insulate a gate electrode from an active layer is provided. A planarization layer 1013 configured to planarize an upper part of the thin-film transistor 1020 is disposed on the thin-film transistor 1020, and the organic light emitting element 1030 is disposed on the planarization layer 1013. The organic light emitting element 1030 is disposed in the emissive area EA, and includes an anode 1031 for supplying a hole to an organic light emitting layer 1032, the organic light emitting layer 1032, and a cathode 1033 for supplying an electron to the organic light emitting layer 1032. The anode 1031 is electrically connected with the thin-film transistor 1020 through a contact hole in the planarization layer 1013. As described above, since the display panel 1090 is a bottom-emission organic light emitting display panel, the anode 1031 includes a transparent conductive layer formed of transparent conductive oxide (TCO). A bank 1014 that defines the emissive area EA is disposed on the anode 1031, and the organic light emitting layer 1032 and the cathode 1033 are disposed on the anode 1031 and the bank 1014. The organic light emitting layer 1032 can emit light of a specific color, for example, light of any one color of white, red, green, and blue. In the following description, it is described that the organic light emitting layer 1032 emits a white light. The cathode 1033 is disposed on the organic light emitting layer 1032. As described above, since the display panel 1090 is a bottom-emission organic light emitting display panel, the cathode 1033 may be formed of a metallic material. The upper substrate 1015 and the lower substrate 1011 are bonded to each other by an adhesive layer 1060. Although not illustrated in FIG. 10b, the display panel 1090 may further include a sealing layer for protecting the organic light emitting element 1030 against moisture or oxygen from the outside.

The black matrix 1040 is disposed on the lower substrate 1011 of the display panel 1090. The black matrix 1040 is disposed at a boundary between the pixels P, a boundary between the emissive area EA and the circuit area CA, a boundary between the transmissive area TA and the circuit area CA, and in the circuit area CA. Further, a color filter 1050 is disposed in the emissive area EA on the lower substrate 1011 of the display panel 1090. The color filter 1050 may be one among a red color filter, a green color filter, and a blue color filter, but is not limited thereto, and may be a color filter that transmits light of another color. An overcoat layer 1016 for planarizing an upper part of the color filter 1050 is disposed on the color filter 1050, and the thin-film transistor 1020 is disposed on the overcoat layer 1016.

The light controlling apparatus 100 may have a function of a light shielding plate by being combined with the display panel 1090. To be specific, referring to FIG. 10b, the light controlling apparatus 100 may be bonded to a front surface of the display panel 1090 that is opposite of a rear surface of the display panel 1090 which is light emitting surface of the display panel 1090. Herein, although not illustrated in FIG. 10b, if an adhesive member, for example, OCA as one among optical transparent adhesives, is used to bond or assemble the light controlling apparatus 100 to the front surface of the transparent display panel 1090 and a lamination process is performed thereto. The light controlling apparatus 100 can finally be combined with the display panel 1090.

The wall 160 of the light controlling apparatus 100 is disposed so as to correspond to the black matrix 1040 of the display panel 1090. That is, as illustrated in FIG. 10b, the wall 160 of the light controlling apparatus 100 is disposed at the boundary between the pixels P, the boundary between the emissive area EA and the circuit area CA, the boundary between the transmissive area TA and the circuit area CA, and in the circuit area CA. Herein, the width WA1 of the wall 160 disposed at the boundary between the pixels P may be equal to or smaller than a width WB1 of the black matrix 1040 disposed at the boundary between the pixels P. The width of the wall 160 disposed in the circuit area CA may be equal to or smaller than a width WB2 of the black matrix 1040 disposed in the circuit area CA. If the wall 160 of the light controlling apparatus 100 is disposed as described above, the wall 160 may be disposed in a mesh structure in a plane view as illustrated in FIG. 10a. Otherwise, although not illustrated, the wall 160 may be disposed in a stripe structure so as to overlap with only a part of the black matrix 1040.

The wall 160 of the light controlling apparatus 100 as described above may be manufactured by the same method as described with reference to FIG. 6c. That is, the wall 160 may be formed by irradiating UV rays with the mask M having the pattern PT corresponding to the black matrix 1040 of the display panel 1090 in order to form the wall 160 at a position corresponding to the black matrix 1040 of the display panel 1090.

Hereinafter, driving methods of a transparent mode and a light shielding mode of the light controlling apparatus 100 will be described with reference to the display device 1000 that supplies an image.

While the display panel 1090 does not supply an image, the light controlling apparatus 100 is driven in a transparent mode. As described above, since the liquid crystal 130a in the liquid crystal unit 130 of the light controlling apparatus 100 is in a homeotropic state as an initial state, while a voltage is not applied to the light controlling apparatus 100, the light controlling apparatus 100 is driven in a transparent mode in which light incident from the outside is transmitted.

Further, while the display panel 1090 supplies an image, the light controlling apparatus 100 is driven so as to block light incident form the front surface that is opposite of the rear surface which is a light emitting surface of the display panel 1090. To be specific, while the display panel 1090 supplies an image, a voltage is applied to the first electrode unit 110 and the second electrode unit 120 of the light controlling apparatus 100 such that there is a voltage difference between the first electrode unit 110 and the second electrode unit 120, and, thus, the liquid crystal 130a in the liquid crystal unit 130 is disposed in disorder. Therefore, the liquid crystal unit 130 scatters light incident from the outside, and the light controlling apparatus 100 suppresses the light incident from the outside from being seen through the rear surface of the display panel 1090. Thus, the quality of an image can be improved.

Furthermore, the display panel 1090 may provide an aesthetic effect to the user, if necessary, in addition to the shielding function. For example, the light controlling apparatus 100 may provide wallpaper or a background image having a color to the user by showing the color of the coloring member 140 constituting the light controlling apparatus 100.

Although FIG. 10b illustrates that the wall 160 of the light controlling apparatus 100 is disposed at all of the boundary between the pixels P, the boundary between the emissive area EA and the circuit area CA, the boundary between the transmissive area TA and the circuit area CA, and in the circuit area CA, the wall 160 may be disposed so as to overlap with only the black matrix 1040 disposed at the boundary between the pixels P of the display panel 1090.

Further, the wall 160 of the light controlling apparatus 100 may also be disposed in the emissive area EA. Since the wall 160 is formed of a UV curing monomer formed of a transparent material capable of transmitting light, the wall 160 may be formed so as to correspond to the entire emissive area EA in order for the portion of the light controlling apparatus 100 corresponding to the emissive area EA to continuously transmit light. In this case, the wall 160 may not be disposed in the circuit area CA.

Also, although FIG. 10b illustrates that the first electrode 112 of the first electrode unit 110 and the second electrode 122 of the second electrode unit 120 are disposed so as to correspond to all of the emissive area EA and the transmissive area TA, the first electrode 112 and the second electrode 122 may be disposed only in the transmissive area TA. That is, since the emissive area EA of the display penal 1090 is an area for emitting light but not an area capable of transmitting an external light, the portion of the light controlling apparatus 100 corresponding to the emissive area EA may not be driven in a light shielding mode and a transparent mode. That is, the portion of the light controlling apparatus 100 corresponding to the emissive area EA may be continuously in a transparent mode. Thus, the first electrode 112 and the second electrode 122 may be disposed only in the transmissive area TA.

Although FIG. 10b illustrates that the light controlling apparatus 100 illustrated in FIG. 1 to FIG. 3 is used as the light controlling apparatus 100, the light controlling apparatus 100 is not limited thereto. The light controlling apparatuses 100 and 200 illustrated in FIG. 4a to FIG. 4d and FIG. 5 may be used by being combined with the display panel 1090. Further, although FIG. 10b illustrates that the first electrode unit 110 of the light controlling apparatus 100 is in contact with the upper substrate 1015 of the display panel 1090, the second electrode unit 120 of the light controlling apparatus 100 may be in contact with the upper substrate 1015 of the display panel 1090.

Furthermore, the upper substrate 1015 of the display panel 1090 may be one of substrates constituting the first electrode unit 110 or the second electrode unit 120 of the light controlling apparatus 100. For example, if the first electrode 112 of the first electrode unit 110 or the second electrode 122 of the second electrode unit 120 constituting the light controlling apparatus 100 is formed on a front surface of the upper substrate 1015 of the display panel 1090, the upper substrate 1015 of the display panel 1090 plays the same role as the substrates 111 and 121 constituting the first electrode unit 110 or the second electrode unit 120. Therefore, the upper substrate 1015, the first electrode 112 of the first electrode unit 110, or the second electrode 122 of the second electrode unit 120 may have the same configuration as the first electrode unit 110 or second electrode unit 120 as described above.

Although FIG. 10a and FIG. 10b illustrate that the transmissive area TA, the circuit area CA, and the emissive area EA are disposed in sequence in one pixel P, the sequence of the transmissive area TA, the circuit area CA, and the emissive area EA in one pixel P is not limited thereto.

Figure 10C:
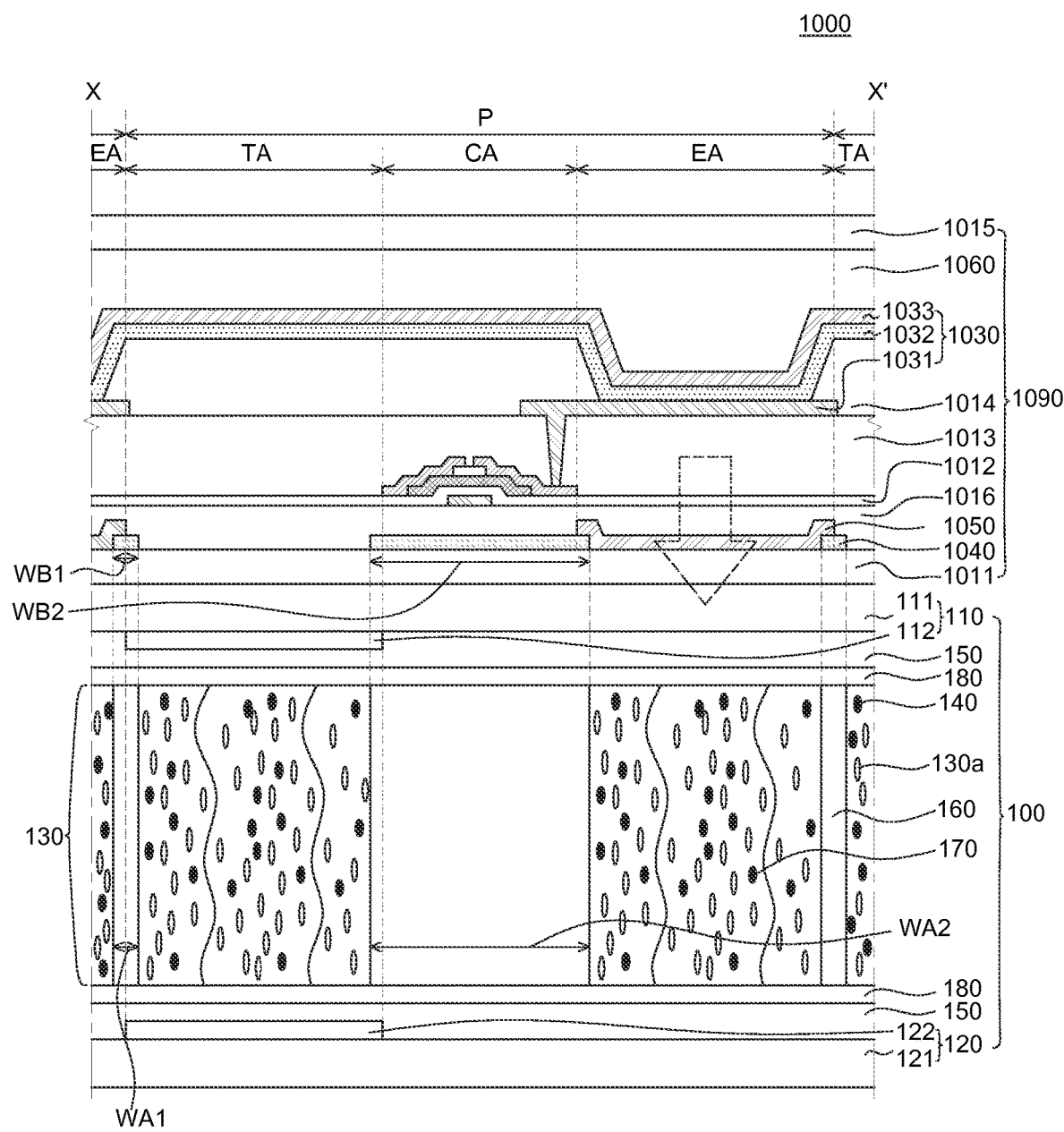
FIG. 10c is a cross-sectional view of a display device according to another exemplary embodiment of the present invention.

FIG. 10c is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 10c.

Referring to FIG. 10c, the light controlling apparatus 100 may be bonded to the rear surface of the display panel 1090 where the display panel 1090 outputs an image. In this case, although not illustrated in FIG. 10c, if an adhesive member, for example, OCA as one among optical transparent adhesives, is used to bond or assemble the light controlling apparatus 100 to the rear surface of the transparent display panel 1090 and a lamination process is performed thereto. The light controlling apparatus 100 can be finally combined with the display panel 1090.

The wall 160 of the light controlling apparatus 100 is disposed so as to correspond to the black matrix 1040 of the display panel 1090. That is, as illustrated in FIG. 10c, as the wall 160 of the light controlling apparatus 100 is disposed so as to overlap with the black matrix 1040 of the display panel 1090 the wall 160 of the light controlling apparatus 100 is disposed at all of the boundary between the pixels P of the display panel 1090, the boundary between the emissive area EA and the circuit area CA, the boundary between the transmissive area TA and the circuit area CA, and in the circuit area CA.

The wall 160 of the light controlling apparatus 100 as described above may be manufactured by the same method as described with reference to FIG. 6c. That is, the wall 160 may be formed by irradiating UV rays with the mask M having the pattern PT corresponding to the black matrix 1040 of the display panel 1090 in order to form the wall 160 at a position corresponding to the black matrix 1040 of the display panel 1090.

Since the light controlling apparatus 100 is disposed on the rear surface of the display panel 1090, the first electrode 112 of the first electrode unit 110 and the second electrode 122 of the second electrode unit 120 are formed so as to correspond to the transmissive area TA only. During a manufacturing process of the light controlling apparatus 100, the liquid crystal 130a and the coloring member 140 are disposed on the entire region of the light controlling apparatus 100. That is, as illustrated in FIG. 6b to FIG. 6d, the light controlling apparatus 100 is manufactured by curing the wall 160 and the network 170 in a state where the mixed liquid crystal mlc is disposed on the entire region of the light controlling apparatus 100. Thus, it may be difficult not to dispose the liquid crystal 130a and the coloring member 140 in a portion of the light controlling apparatus 100 corresponding to the emissive area EA to leave the corresponding space empty during a process. Therefore, if the first electrode 112 and the second electrode 122 are disposed in the emissive area EA, the light controlling apparatus 100 may also be driven in the emissive area EA. Accordingly, light emitted from the emissive area EA may be blocked by the light controlling apparatus 100. Thus, as illustrated in FIG. 10c, the first electrode 112 and the second electrode 122 are disposed so as to correspond to the transmissive area TA only, so that only a portion of the light controlling apparatus 100 corresponding to the transmissive area TA is driven and a portion of the light controlling apparatus 100 corresponding to the emissive area EA is continuously maintained in a transparent mode.

Hereinafter, driving methods of a transparent mode and a light shielding mode of the light controlling apparatus 100 will be described with reference to the display device 1000 that supplies an image.

While the display panel 1090 does not supply an image, the light controlling apparatus 100 is driven in a transparent mode. That is, while a voltage is not applied to the light controlling apparatus 100, the light controlling apparatus 100 is realized in a transparent mode in which light incident from the outside is transmitted.

While the display panel 1090 supplies an image, the light controlling apparatus 100 is realized so as to block light incident from the rear surface. To be specific, while the display panel 1090 supplies an image, a voltage is applied to the first electrode 112 and the second electrode 122 of the light controlling apparatus 100, and, thus, the liquid crystal 130a in the liquid crystal unit 130 is disposed in disorder and the liquid crystal unit 130 scatters light incident from the outside. Therefore, the light controlling apparatus 100 blocks the light incident from the outside from being seen through the transmissive area TA of the display panel 1090. Thus, the quality of an image can be improved. In this case, since the first electrode 112 and the second electrode 122 are not formed in the portion of the light controlling apparatus 100 corresponding to the emissive area EA, the light controlling apparatus 100 is still realized in a transparent mode, and, thus, the user can see an image through the emissive area EA.

Although FIG. 10c illustrates that the wall 160 of the light controlling apparatus 100 is disposed at all of the boundary between the pixels P, the boundary between the emissive area EA and the circuit area CA, the boundary between the transmissive area TA and the circuit area CA, and in the circuit area CA, the wall 160 may be disposed so as to overlap with only the black matrix 1040 disposed at the boundary between the pixels P of the display panel 1090.

Further, the wall 160 of the light controlling apparatus 100 may also be disposed in the emissive area EA. Since the wall 160 is formed of a UV curing monomer formed of a transparent material capable of transmitting light, the wall 160 may be formed so as to correspond to the entire emissive area EA in order for the portion of the light controlling apparatus 100 corresponding to the emissive area EA to continuously transmit light. In this case, the wall 160 may not be disposed in the circuit area CA.

The lower substrate 1011 of the display panel 1090 may be one of substrates constituting the first electrode unit 110 or the second electrode unit 120 of the light controlling apparatus 100. For example, if the first electrode 112 of the first electrode unit 110 or the second electrode 122 of the second electrode unit 120 constituting the light controlling apparatus 100 is formed on a front surface of the lower substrate 1011 of the display panel 1090, the lower substrate 1011 of the display panel 1090 plays the same role as the substrates 111 and 121 constituting the first electrode unit 110 or the second electrode unit 120. Therefore, the lower substrate 1011, the first electrode 112 of the first electrode unit 110, or the second electrode 122 of the second electrode unit 120 may have the same configuration as the first electrode unit 110 or second electrode unit 120 as described above.

Although the present invention has been described above with reference to the specific exemplary embodiments, the exemplary embodiments are provided for illustrative purposes only but not intended to limit the light controlling apparatus, display device including the same and the method of fabricating the same according to the present invention. It is clear that the exemplary embodiments can be modified or improved by a person having ordinary skill in the art within a technical concept of the present invention.

All of simple modifications or changes of the present invention are included in the scope of the present invention, and the protective scope of the present invention will be more clearly understood from the appended claims.

What is claimed is:

1. A light controlling apparatus comprising:
    a first electrode unit and a second electrode unit facing each other, where the first and second electrode units have a refractive index in a range of 1.6 to 1.8;
    a refractive index matching layer;
    a liquid crystal unit between the first electrode unit and the second electrode unit, the liquid crystal unit having a refractive index in a range of 1.3 to 1.6 and including:

a liquid crystal;
a wall having a first polymer being polymerized from a first monomer, the first monomer having a higher diffusion speed and a lower polymerization rate than that of a second monomer; and
a network having a second polymer being polymerized from the second monomer, the second monomer having a lower diffusion speed and a higher polymerization rate than that of the first monomer,
wherein the first monomer is UV curable and the second monomer is thermally curable or the second monomer is UV curable at a wavelength range different from that of the first monomer,
wherein the refractive index matching layer is disposed between the first electrode unit and the liquid crystal unit, and between the second electrode unit and the liquid crystal unit, and
wherein the refractive index matching layer has a refractive index in a range of 1.3 to 1.8.

2. The light controlling apparatus according to claim 1, further comprising a spacer on at least one among the first electrode unit and the second electrode unit.

3. The light controlling apparatus according to claim 1, wherein each of the first polymer and the second polymer is polymerized from at least one monomer selected from the group consisting of UV-curable monomers, polydimethylsiloxane, RM (reactive mesogen)-based monomers, NOA (Norland Optical Adhesive)-based monomers, bisphenol A dimethacrylate-based monomers, and photo resist.

4. The light controlling apparatus according to claim 1, wherein if the liquid crystal includes one selected from the group consisting of a negative type liquid crystal and a DFLC (dual frequency liquid crystal), each of the first electrode unit and the second electrode unit comprises a common electrode.

5. The light controlling apparatus according to claim 4, wherein the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

6. The light controlling apparatus according to claim 1, wherein if the liquid crystal includes one selected from the group consisting of a positive type liquid crystal and a DFLC (dual frequency liquid crystal), at least one among the first electrode unit and the second electrode unit includes at least one patterned electrode.

7. The light controlling apparatus according to claim 6, wherein a horizontal electric field is applied to the patterned electrode.

8. The light controlling apparatus according to claim 7, wherein the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

9. The light controlling apparatus according to claim 1, wherein if the liquid crystal includes one selected from the group consisting of a positive type liquid crystal and a DFLC (dual frequency liquid crystal), at least one among the first electrode unit and the second electrode unit includes at least one patterned electrode and a common electrode.

10. The light controlling apparatus according to claim 9, wherein a horizontal electric field is applied to the patterned electrode and the common electrode.

11. The light controlling apparatus according to claim 10, wherein the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

12. The light controlling apparatus according to claim 1, further comprising an alignment member in the liquid crystal unit and configured to vertically align the liquid crystal, wherein the light controlling apparatus exhibits a transparent mode when a voltage is not applied.

13. A display device comprising:
a display panel; and
at least one light controlling apparatus according to claim 1 attached to the display panel.

14. The display device according to claim 13, wherein the display panel is an OLED panel.

15. The display device according to claim 13, wherein the light controlling apparatus is attached to the front surface of the display panel.

16. The display device according to claim 13, wherein the light controlling apparatus is attached to the rear surface of the display panel.

17. A method of fabricating a light controlling apparatus, comprising:
laminating a first electrode unit to a second electrode unit, where the first and second electrode units have a refractive index in a range of 1.6 to 1.8;
forming a mixed liquid crystal unit having a refractive index in a range of 1.3 to 1.6 between the first electrode unit and the second electrode unit, the mixed liquid crystal unit having a mixed liquid crystal, and the mixed liquid crystal having a first monomer, a second monomer and a liquid crystal;
positioning a refractive index matching layer on the mixed liquid crystal unit;
positioning a mask having a pattern on the first electrode unit or on the second electrode unit;
forming a wall in a region corresponding to the pattern by polymerizing the first monomer by primary curing of the mixed liquid crystal, the first monomer having a higher diffusion speed and a lower polymerization rate than that of the second monomer; and
forming a network by polymerizing the second monomer by secondary curing of the mixed liquid crystal, the second monomer having a lower diffusion speed and a higher polymerization rate than that of the first monomer,
wherein the primary curing includes UV irradiation and the secondary curing includes thermal treatment or the secondary curing includes UV irradiation at a wavelength range different from that of the primary curing, and
wherein the refractive index matching layer has a refractive index in a range of 1.3 to 1.8.

18. The method of fabricating a light controlling apparatus, according to claim 17, further comprising disposing a spacer on at least one among the first electrode unit and the second electrode unit.

19. The method of fabricating a light controlling apparatus according to claim 17, wherein the primary curing includes a wavelength within a range of 360 nm to 380 nm, and the secondary curing includes a wavelength within a range of 330 nm to 360 nm.

20. A mixed liquid crystal in which a liquid crystal, a first monomer and a second monomer are dispersed, comprising:
the first monomer which is configured to be polymerized by initial curing due to a higher diffusion speed and a lower polymerization rate than that of the second monomer so as to form a wall for a light controlling apparatus; and the second monomer which is configured to be polymerized by subsequent curing due to a lower diffusion speed and a higher polymerization rate than that of the first monomer so as to form a network for the light controlling apparatus, wherein the first monomer is UV curable and the second monomer is thermally curable or the second monomer is UV curable at a wavelength range different from that of the first monomer, and wherein the mixed liquid crystal is contained in a liquid crystal unit having a refractive index in a range of 1.3 to 1.6 and a refractive index matching layer is positioned on the mixed liquid crystal unit, and wherein the refractive index matching layer has a refractive index in a range of 1.3 to 1.8.

21. The mixed liquid crystal according to claim 20, wherein the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

22. The mixed liquid crystal according to claim 20, wherein a ratio of the first monomer to the second monomer includes 1:1 to 1:1.25 or 1:1 to 2.5:1.

23. The mixed liquid crystal according to claim 20, wherein the liquid crystal includes one selected from the group consisting of a positive type liquid crystal, a negative type liquid crystal, and a DFLC (dual frequency liquid crystal).

* * * * *